(12) United States Patent
Tzeng et al.

(10) Patent No.: US 8,748,284 B2
(45) Date of Patent: Jun. 10, 2014

(54) METHOD OF MANUFACTURING DECOUPLING MIM CAPACITOR DESIGNS FOR INTERPOSERS

(75) Inventors: Kuo-Chyuan Tzeng, Chu-Pei (TW); Kuo-Chi Tu, Hsin-Chu (TW); Chen-Jong Wang, Hsin-Chu (TW); Hsiang-Fan Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 151 days.

(21) Appl. No.: 13/209,195

(22) Filed: Aug. 12, 2011

(65) Prior Publication Data

US 2013/0037910 A1 Feb. 14, 2013

(51) Int. Cl.
*H01L 21/20* (2006.01)

(52) U.S. Cl.
USPC ........................................... 438/396; 257/532

(58) Field of Classification Search
USPC .................. 257/532, 738, E21.011, E23.145, 257/E27.026; 438/400, 396, 397, 398, 399
See application file for complete search history.

(56) References Cited

U.S. PATENT DOCUMENTS

| | | | |
|---|---|---|---|
| 5,391,917 A | 2/1995 | Gilmour et al. | |
| 5,510,298 A | 4/1996 | Redwine | |
| 5,767,001 A | 6/1998 | Bertagnolli et al. | |
| 5,998,292 A | 12/1999 | Black et al. | |
| 6,184,060 B1 | 2/2001 | Siniaguine | |
| 6,322,903 B1 | 11/2001 | Siniaguine et al. | |
| 6,448,168 B1 | 9/2002 | Rao et al. | |
| 6,465,892 B1 | 10/2002 | Suga | |
| 6,472,293 B1 | 10/2002 | Suga | |
| 6,538,333 B2 | 3/2003 | Kong | |
| 6,599,778 B2 | 7/2003 | Pogge et al. | |
| 6,639,303 B2 | 10/2003 | Siniaguine | |
| 6,664,129 B2 | 12/2003 | Siniaguine | |
| 6,693,361 B1 | 2/2004 | Siniaguine et al. | |
| 6,740,582 B2 | 5/2004 | Siniaguine | |
| 6,800,930 B2 | 10/2004 | Jackson et al. | |
| 6,841,883 B1 | 1/2005 | Farnworth et al. | |
| 6,882,030 B2 | 4/2005 | Siniaguine | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 7,030,481 B2 | 4/2006 | Chudzik et al. | |
| 7,049,170 B2 | 5/2006 | Savastiouk et al. | |
| 7,060,601 B2 | 6/2006 | Savastiouk et al. | |
| 7,071,546 B2 | 7/2006 | Fey et al. | |
| 7,111,149 B2 | 9/2006 | Eilert | |
| 7,122,912 B2 | 10/2006 | Matsui | |
| 7,157,787 B2 | 1/2007 | Kim et al. | |
| 7,193,308 B2 | 3/2007 | Matsui | |
| 7,195,970 B2* | 3/2007 | Tu et al. | 438/239 |
| 7,262,495 B2 | 8/2007 | Chen et al. | |
| 7,297,574 B2 | 11/2007 | Thomas et al. | |
| 7,335,972 B2 | 2/2008 | Chanchani | |
| 7,355,273 B2 | 4/2008 | Jackson et al. | |
| 2005/0082586 A1* | 4/2005 | Tu et al. | 257/296 |
| 2010/0213572 A1* | 8/2010 | Ching et al. | 257/532 |
| 2011/0193221 A1* | 8/2011 | Hu et al. | 257/737 |

* cited by examiner

*Primary Examiner* — Julio J Maldonado
*Assistant Examiner* — Robert Bachner
(74) *Attorney, Agent, or Firm* — Slater and Matsil, L.L.P.

(57) ABSTRACT

Decoupling metal-insulator-metal (MIM) capacitor designs for interposers and methods of manufacture thereof are disclosed. In one embodiment, a method of forming a decoupling capacitor includes providing a packaging device, and forming a decoupling MIM capacitor in at least two metallization layers of the packaging device.

20 Claims, 24 Drawing Sheets

METHOD OF MANUFACTURING DECOUPLING MIM CAPACITOR DESIGNS FOR INTERPOSERS

BACKGROUND

Semiconductor devices are used in a variety of electronic applications, such as personal computers, cell phones, digital cameras, and other electronic equipment, as examples. The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications. One type of smaller packaging that has been developed is three-dimensional (3D) ICs, in which two die or ICs are bonded together and electrical connections are formed between the die and contact pads on an interposer.

Typically, power and ground lines are routed to logic gates and other devices in integrated circuits. The current from a power supply flows through the power lines, logic gates, and finally to ground. During the switching of the logic gates, a large amount of change in the current may occur within a short period of time. Decoupling capacitors are used to absorb these glitches during current switching. Decoupling capacitors function as charge reservoirs by maintaining a constant voltage between the supply voltage and ground, preventing momentary drops in the supplied voltage.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related to packages for semiconductor devices that utilize an interposer as a component, such as 3DICs. Novel methods of forming decoupling MIM capacitors in interposers will be described herein.

Figure 1A:
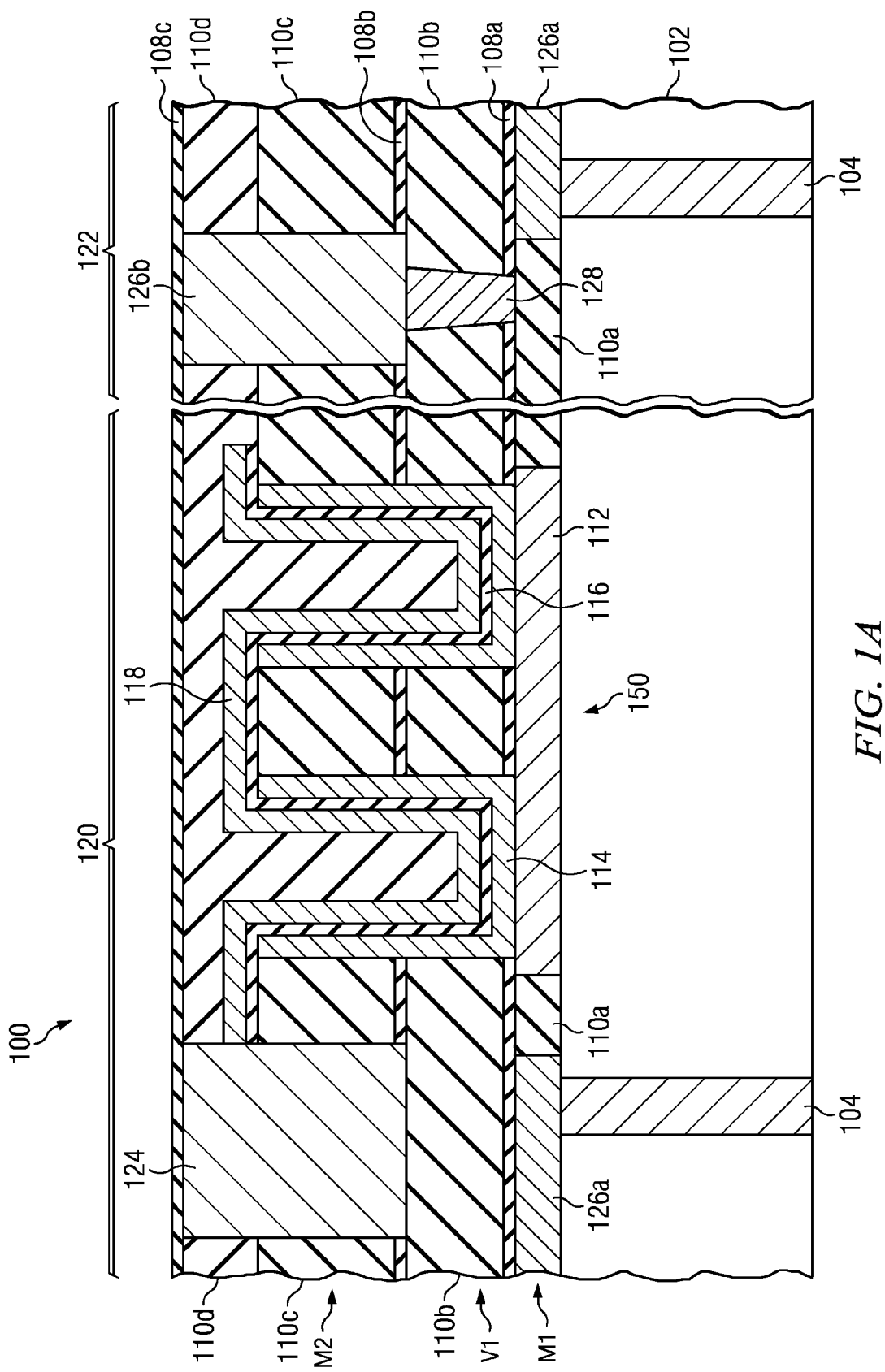
FIGS. 1A through 1G show cross-sectional views of a decoupling MIM capacitor formed in two metallization layers of an interposer in accordance with an embodiment of the present disclosure at various stages of manufacturing.
Figure 1B:
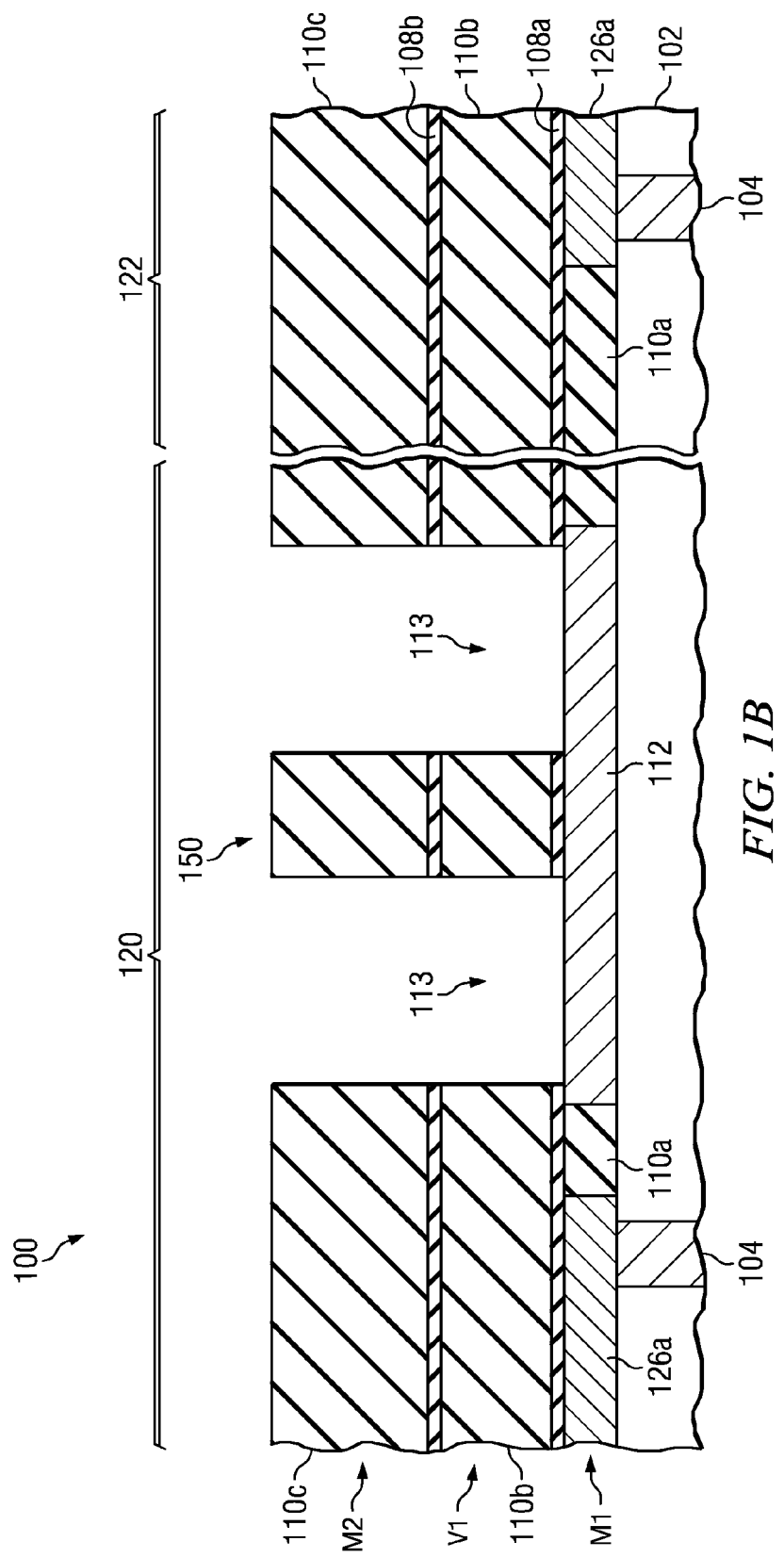

Referring first to FIG. 1A, a cross-sectional view is shown of a decoupling MIM capacitor 150 formed in two adjacent metallization layers M2 and V1 of an interposer 100 in accordance with an embodiment of the present disclosure. A method of manufacturing the decoupling MIM capacitor 150 at various stages is shown in FIGS. 1B through 1G. First, an interposer workpiece or substrate 102 is provided that has a plurality of through-silicon vias (TSVs) 104 formed therein, as shown in FIG. 1B. The TSVs 104 are also referred to herein as through-substrate vias. The TSVs 104 are conductive and provide a connection from a front side of the interposer substrate 102 to the back side. The substrate 102 may comprise silicon or other semiconductive materials, for example.

Metallization layer M1 is formed over the substrate 102. The metallization layer M1 may be formed by depositing a metal layer and patterning the metal layer to form conductive lines 126a. An insulating layer 110a may then be formed over the patterned metal layer. Alternatively, the metallization layer M1 may be formed using a damascene process, wherein the insulating layer 110a is deposited over the substrate 102 and then patterned and filled with a metal layer to form conductive lines 126a. Excess metal may be removed from the top surface of the insulating layer 110a using a chemical-mechanical polishing (CMP) process, for example, using a single damascene process. The insulating layer 110a may comprise silicon dioxide or other insulators, and the conductive lines 126a may comprise copper, copper alloys, or other conductors, as examples.

In accordance with some embodiments, a bottom plate pick-up 112 is also formed in the metallization layer M1 when the conductive lines 126a are formed. The bottom plate pick-up 112 provides electrical connection to the bottom electrode of the decoupling MIM capacitor 150, e.g., bottom electrode material 114, as shown in FIG. 1A. The bottom plate pick-up 112 is formed in an adjacent metallization layer M1 to the decoupling MIM capacitor 150 in some embodiments, e.g., in a metallization layer M1 disposed beneath a metallization layer V1 that a portion of the decoupling MIM capacitor 150 is formed in.

Next, an etch stop layer 108a may be formed over the metallization layer M1, as shown in FIG. 1B. The etch stop layer 108a may comprise SiC in some embodiments, although alternatively, the etch stop layer 108a may comprise SiN or other insulating materials. Insulating layer 110b is then deposited or formed over the workpiece 102, e.g., over the etch stop layer 108a. The insulating layer 110b is also referred to herein as a first insulating layer, for example. An etch stop layer 108b is then formed over the insulating layer 110b. The etch stop layer 108b may comprise SiN or other insulating materials. An insulating layer 110c is then deposited or formed over the etch stop layer 108b. The insulating layer 110c is also referred to herein as a second insulating layer. Insulating layers 110b and 110c may comprise undoped silicon glass (USG) oxide or other insulating materials, as examples.

In the embodiment shown in FIGS. 1A through 1G, a pattern for at least one decoupling MIM capacitor is formed using a separate lithography mask to pattern insulating layers 110c and 110b. After the insulating layer 110c is formed or deposited, insulating layers 110c and 110b are patterned, as shown in FIG. 1B, forming patterns 113 having a desired shape for the at least one decoupling MIM capacitor 150 within the insulating layers 110c and 110b. The width of the patterns 113 in the insulating layers 110c and 110b may comprise about 50 nm to 500 nm, for example, and the patterns 113 may be substantially circular, oval, square, or round in a top view (not shown), as examples.

Figure 1C:
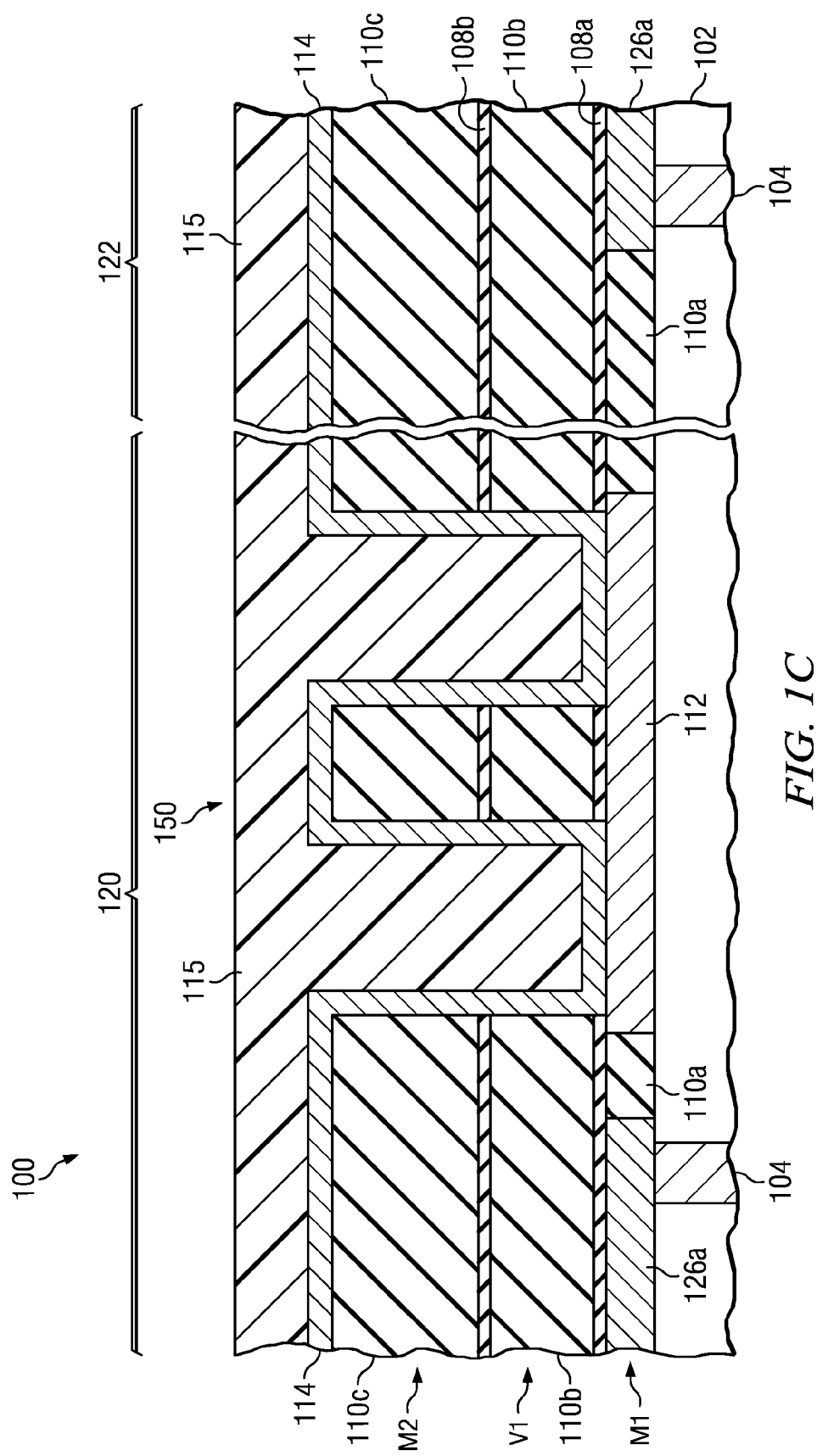
Figure 1D:
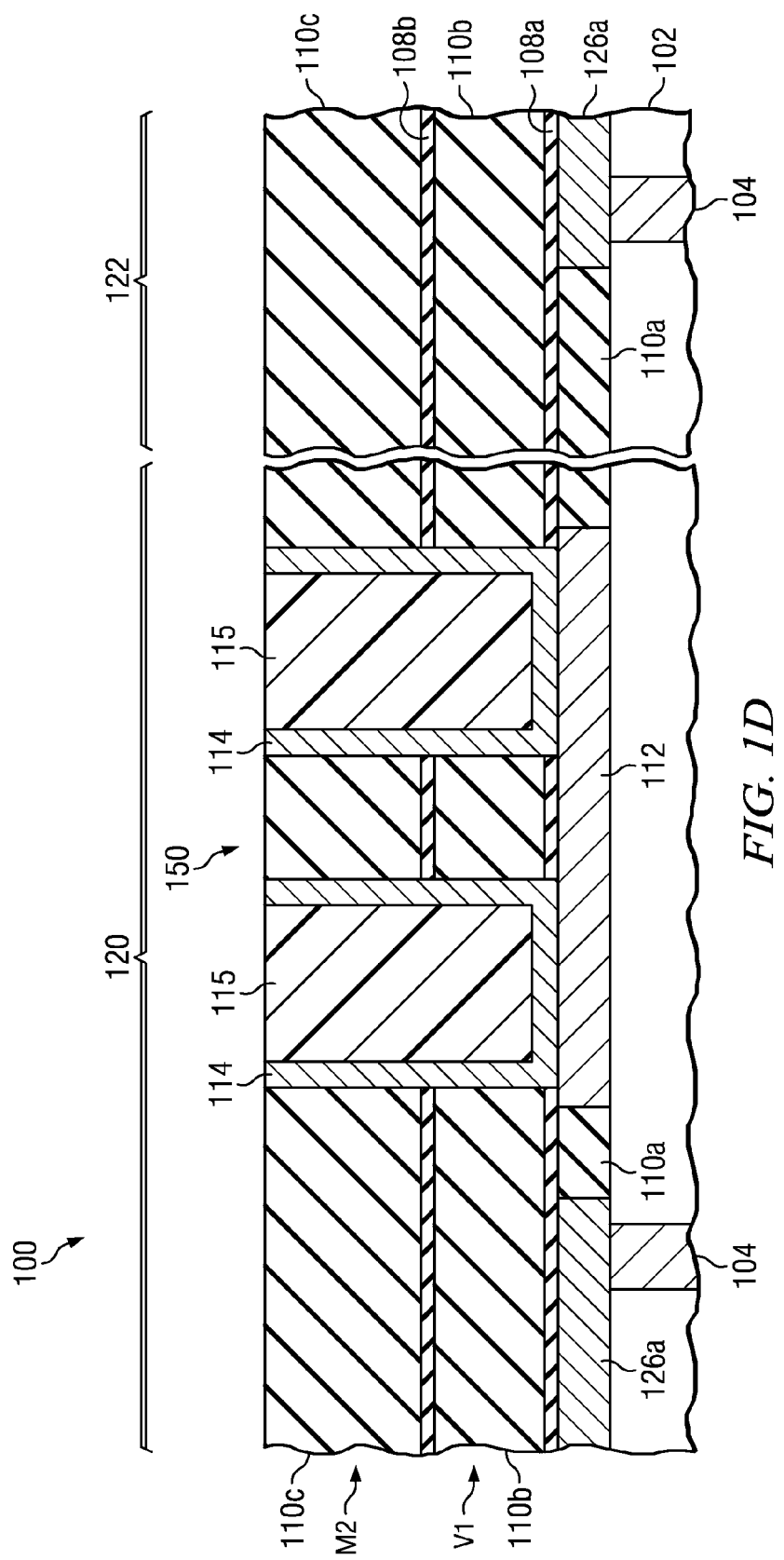

Next, a bottom electrode material 114 is formed over the second insulating layer 110c, as shown in FIG. 1C, lining the patterns 113 formed in the first and second insulating layers 110b and 110c for the at least one decoupling MIM capacitor 150. The bottom electrode material 114 may comprise a layer of TaN or TiN deposited in a thickness of about 10 nm to 30 nm, for example although alternatively, the bottom electrode material 114 may comprise other conductive materials and dimensions. The bottom electrode material 114 is removed from a top surface of the second insulating layer 110c, e.g., using one or more etch processes, CMP processes, or a combination thereof. The bottom electrode material 114 may be removed from the top surface of the second insulating layer 110c using a layer of photoresist 115 and an etch process, for example, shown in FIGS. 1C and 1D. The layer of photoresist 115 is then removed.

Figure 1E:
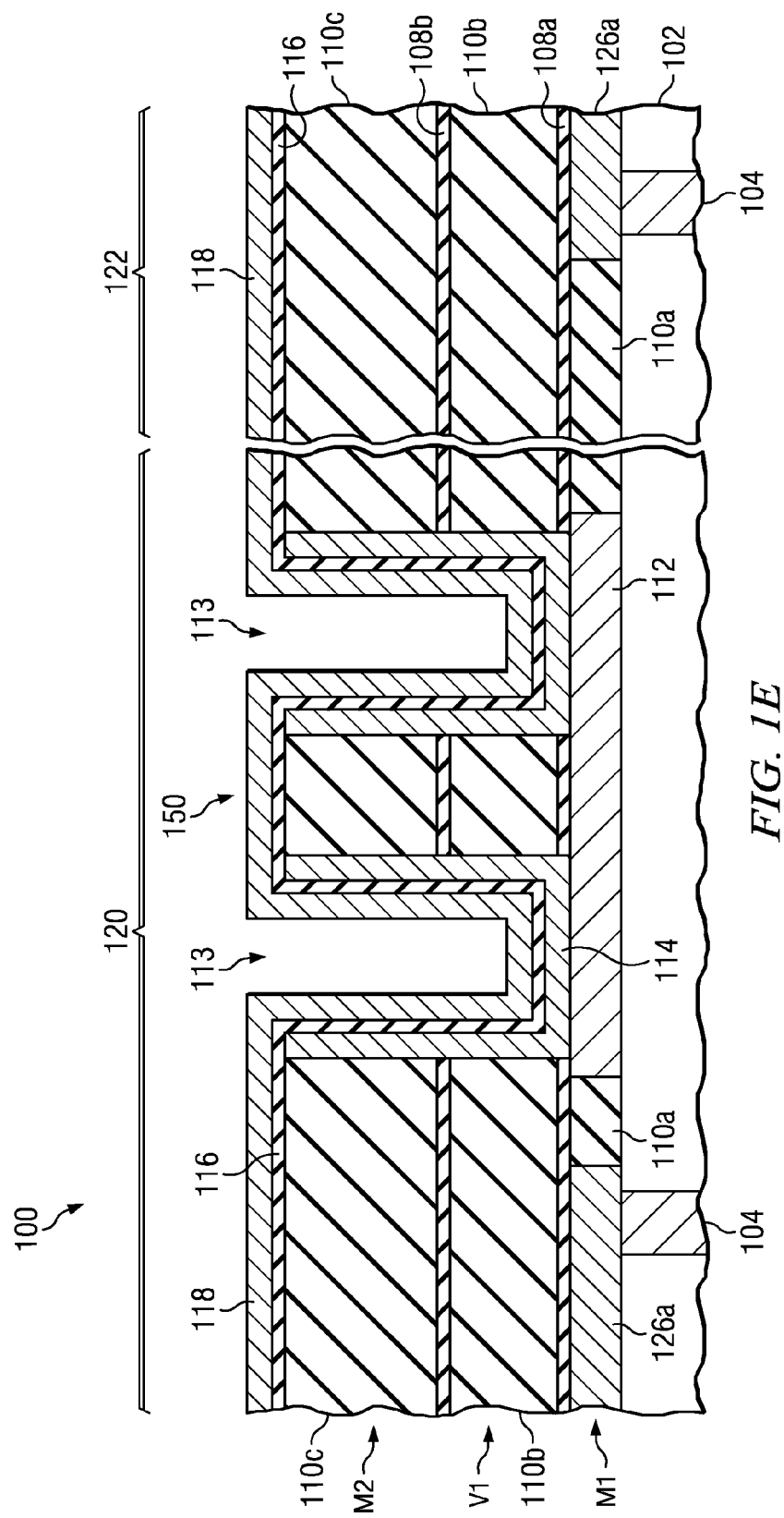

A dielectric material 116 is then formed over the bottom electrode material 114 and over the top surface of the second insulating layer 110c, as shown in FIG. 1E. The dielectric material 116 comprises a capacitor dielectric material for the at least one decoupling MIM capacitor 150. The dielectric material 116 may comprise a high dielectric constant (k) material having a dielectric constant greater than the dielectric constant of $SiO_2$, for example, such as ZrO, HfO, $Si_3N_4$, or BST, although alternatively, the capacitor dielectric material 116 may comprise other materials. The dielectric material 116 may comprise a thickness of about 5 nm to 20 nm or other dimensions. A top electrode material 118 comprising similar materials and dimensions as described for the bottom electrode material 114 is then formed over the capacitor dielectric material 116, also shown in FIG. 1E.

Figure 1F:
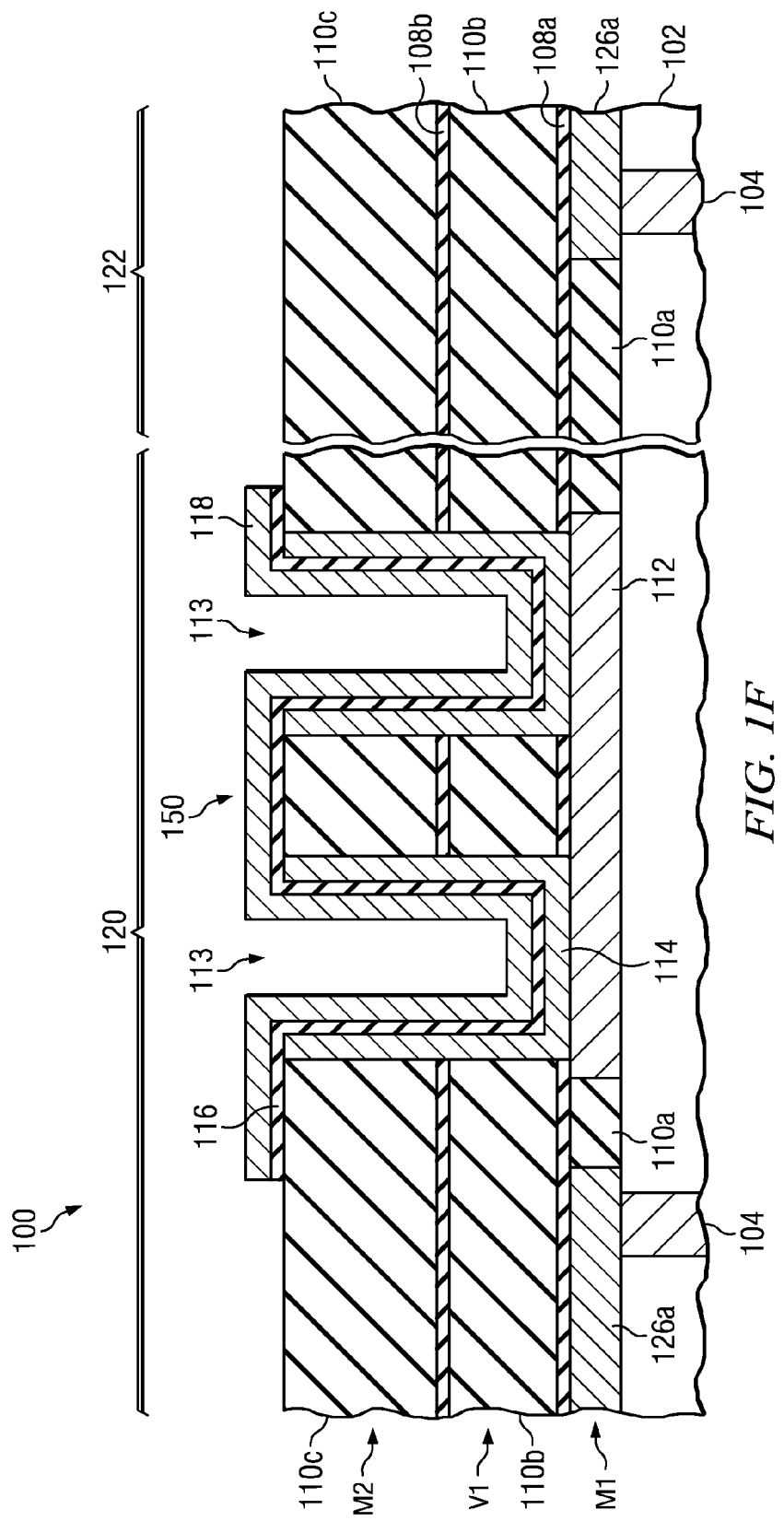

The top electrode material 118 and the capacitor dielectric material 116 are then patterned using an additional lithography mask to remove the top electrode material 118 and capacitor dielectric material 116 from other regions 122 that may comprise logic regions or other connection regions of the interposer 100, for example, as shown in FIG. 1F. Portions of the top electrode material 118 and the capacitor dielectric material 116 may also be removed in region 120 of the interposer 100 to form a desired shape of the top capacitor plate of the decoupling MIM capacitor 150 comprising the top electrode material 118, which may comprise an array region, for example. The top electrode material 118, capacitor dielectric material 116, and bottom electrode material 114 form at least one decoupling MIM capacitor 150 for the interposer 100 in region 120, advantageously.

Figure 1G:
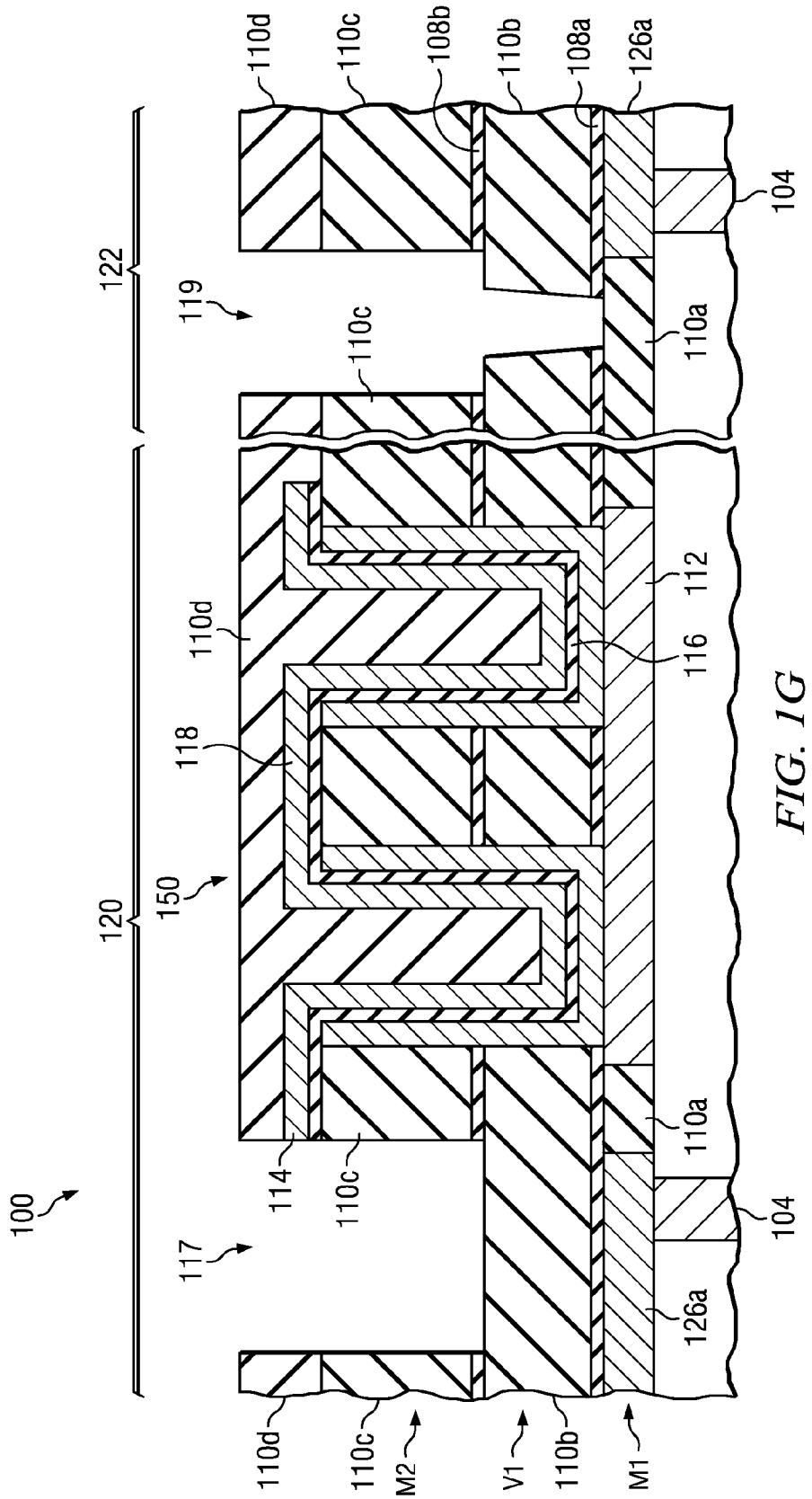

The manufacturing process is then continued to complete the fabrication of the metallization layers V1 and M2. For example, insulating layer 110d may be formed over the decoupling MIM capacitors 150 and insulating layer 110c, as shown in FIG. 1G. The insulating layer 110d may comprise USG oxide film or similar materials as described for insulating layers 110c and 110b. The insulating layer 110d may be exposed to a CMP process to return the total thickness of insulating layers 110b, 110c, and 110d to the original total thickness of layers 110b and 110c before the CMP process used to form the decoupling MIM capacitors 150, for example.

Manufacturing processes may then be continued to form conductive lines 126b and vias 128 in metallization layers M2 and V1, within insulating layers 110d/110c and 110b, respectively, in region 122, as shown in FIG. 1A. An additional etch stop layer 108c may be formed over insulating layer 110d, as shown. Patterns 117 and 119 for a top plate pick-up 124 and the conductive lines 126b and vias 128, respectively, shown in FIG. 1G, may be formed using a dual damascene process, for example. Conductive material is then deposited over the insulating layer 110d to fill the patterns 117 and 119, and excess conductive material is removed using one or more etch processes or CMP processes, leaving the structure shown in FIG. 1A. In accordance with some embodiments, a top plate pick-up 124 is also formed in insulating layer 110c/110d. The top plate pick-up 124 is coupled to a portion of the top electrode material 118 of the decoupling MIM capacitor 150, as shown. Advantageously, an additional lithography mask is not required to form the top plate pick-up 124 or the bottom plate pick-up 112: these pick-ups 124 and 112 may be patterned by altering an existing mask used to pattern metallization layers M2 and M1, respectively.

Figure 2:
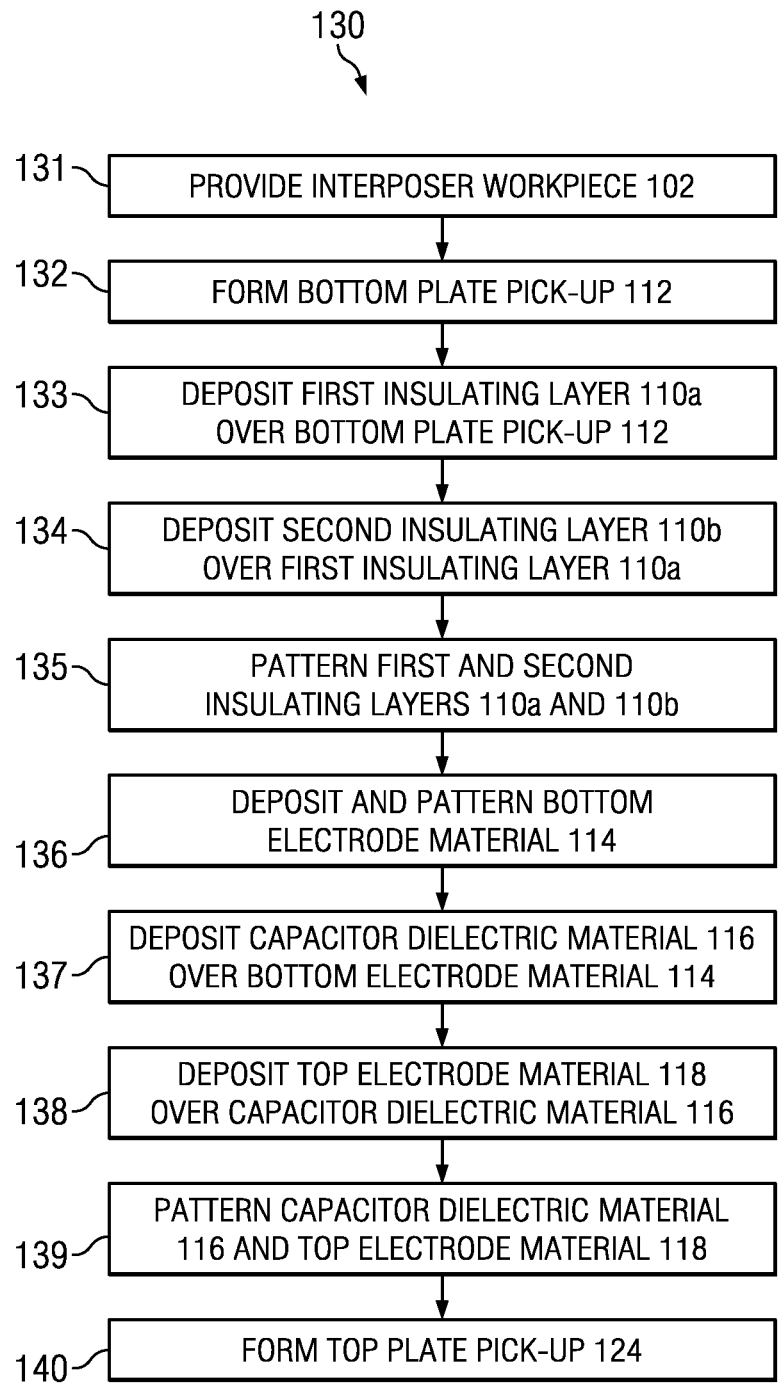
FIG. 2 is a flow chart for forming decoupling MIM capacitors in an interposer in accordance with an embodiment.

FIG. 2 is a flow chart 130 for forming decoupling MIM capacitors 150 in an interposer 100 in accordance with an embodiment of the present disclosure. To form decoupling MIM capacitors 150, first, an interposer workpiece 102 is provided (step 131). A bottom plate pick-up 112 is formed over the workpiece 102 (step 132). A first insulating layer 110a is deposited over the bottom plate pick-up 112 (step 133). A second insulating layer 110b is deposited over the first insulating layer 110a (step 134). The first and second insulating layers 110a and 110b are patterned (step 135). A bottom electrode material 114 is then deposited and patterned (step 136). A decoupling capacitor dielectric material 116 is deposited over the bottom electrode material 114 (step 137). A top electrode material 118 is deposited over the capacitor dielectric material 116 (step 138). The capacitor dielectric material 116 and the top electrode material 118 are patterned (step 139) to form the decoupling MIM capacitor 150. The pattern may be achieved by lithography masks and processes, as described with respect to FIGS. 1A through 1G, or the patterning may be achieved by CMP processes, to be described further herein. A top plate pick-up 124 is formed (step 140) that is coupled to the top electrode material 118.

In the embodiment shown in FIGS. 1A through 1G, two additional lithography masks are used: a first lithography mask that is used to pattern the bottom electrode material 114 and a second lithography mask that is used to pattern the top electrode material 118 and the capacitor dielectric material 116. FIGS. 3A through 3H are cross-sectional views of a method of forming a decoupling MIM capacitor 150 in an interposer 100 in accordance with another embodiment, wherein only one additional lithography mask is required to form the decoupling MIM capacitor 150. Like numerals are used for the various elements in FIGS. 3A through 3H that were used to describe FIGS. 1A through 1G, and to avoid repetition, each reference number shown in FIGS. 3A through 3H is not described again in detail herein.

Figure 3A:
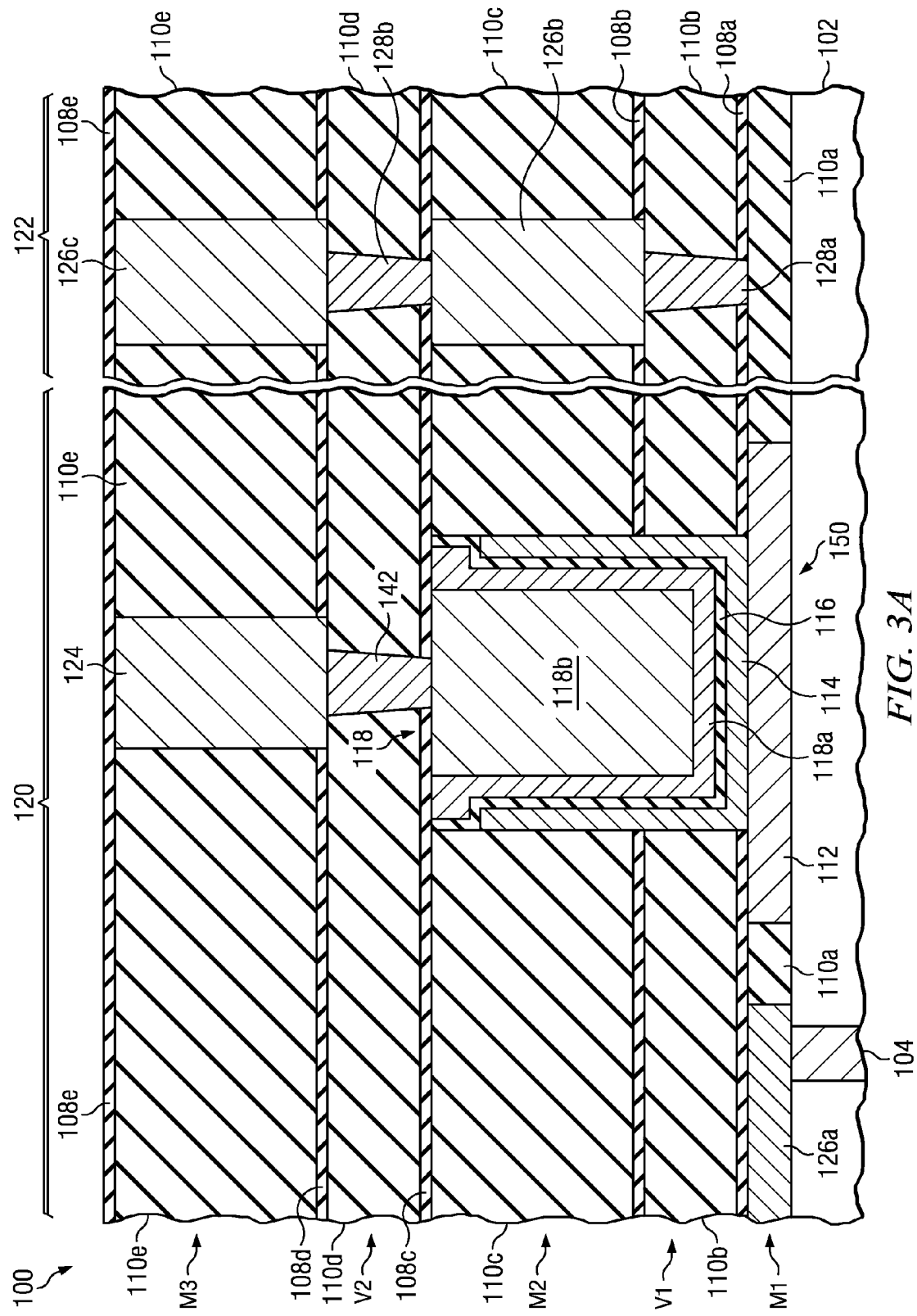
FIGS. 3A through 3H are cross-sectional views of a decoupling MIM capacitor formed in an interposer in accordance with another embodiment at various stages.
Figure 3B:
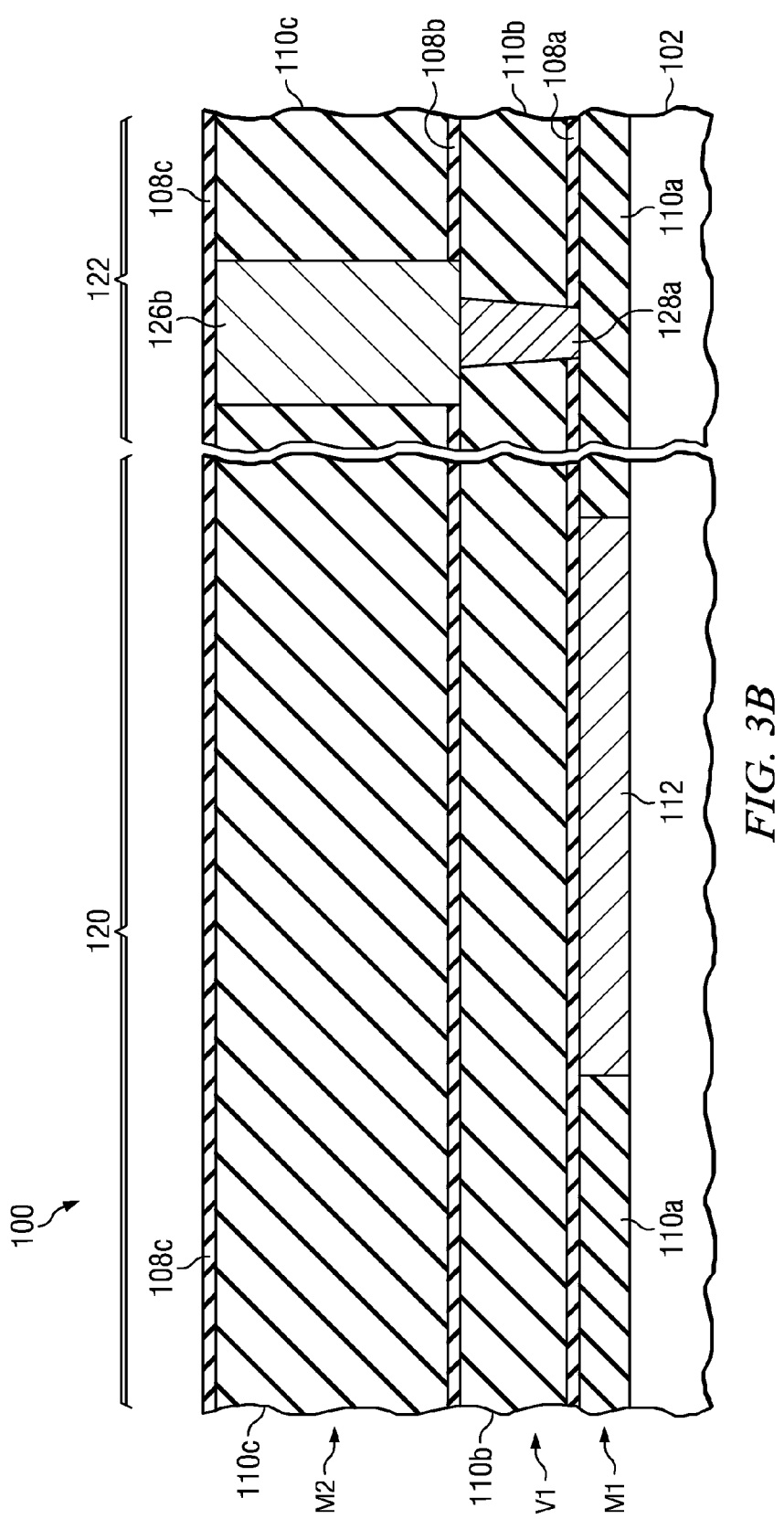
Figure 3C:
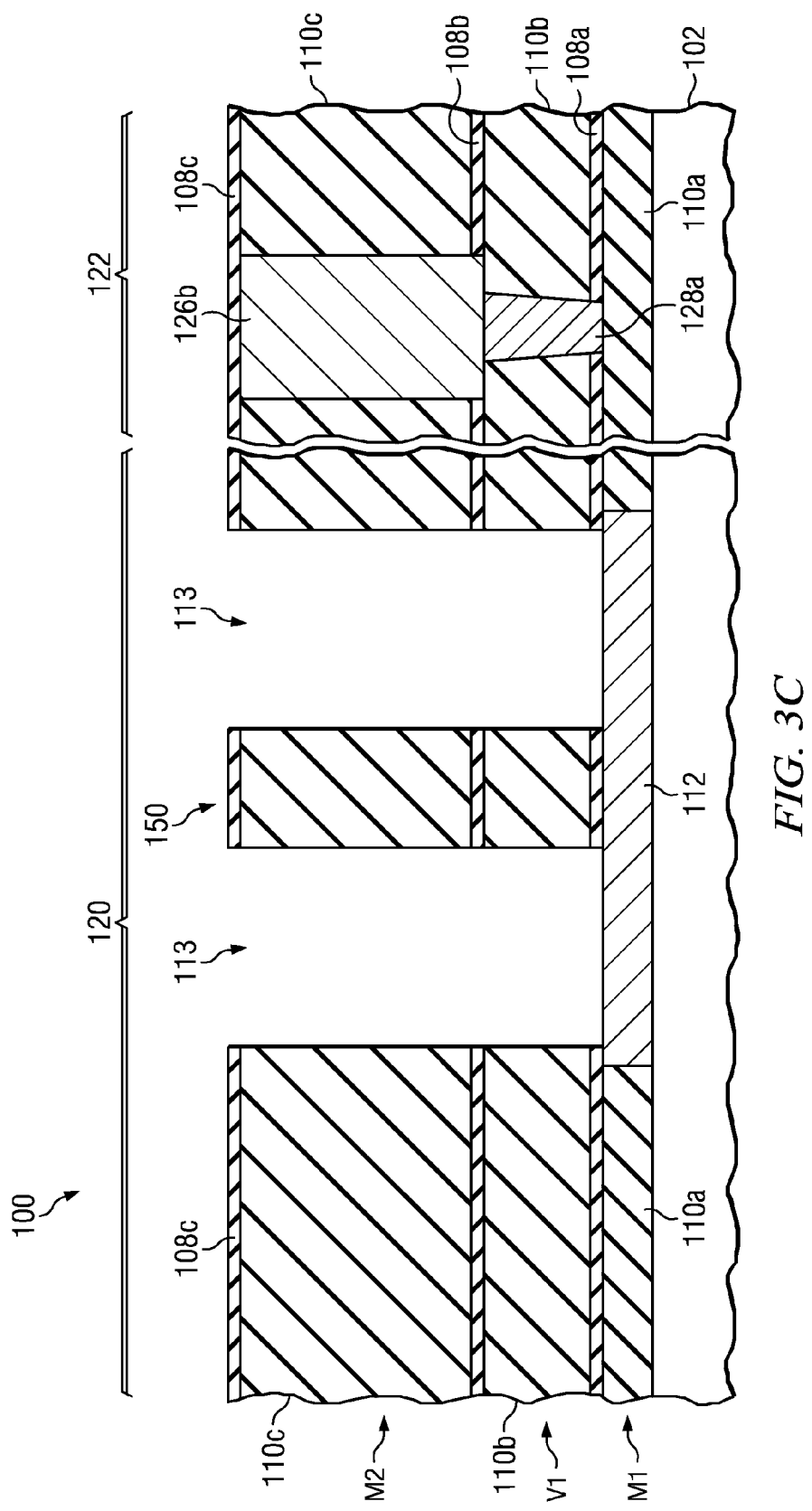
Figure 3D:
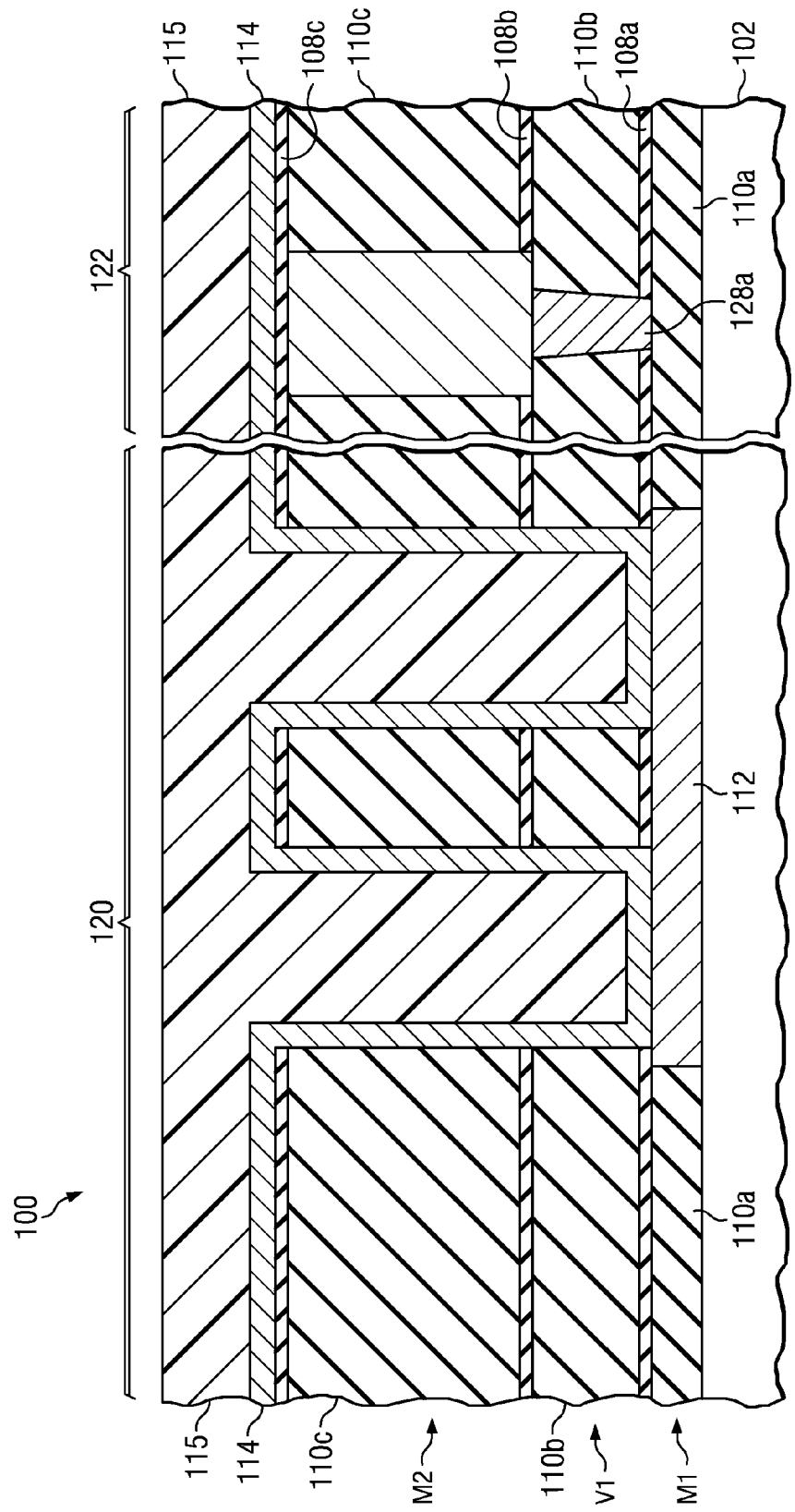
Figure 3E:
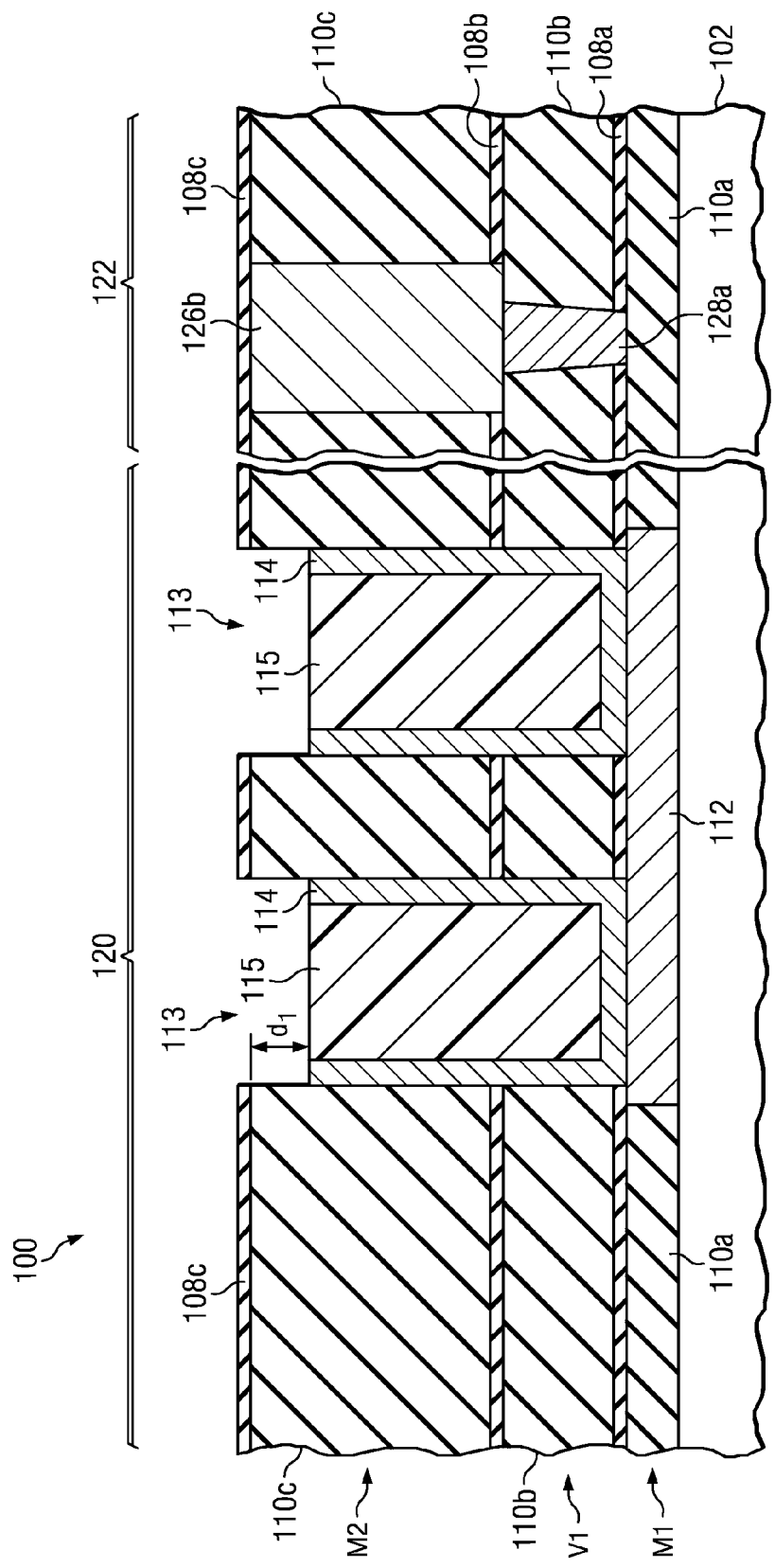

In the embodiment shown in FIGS. 3A through 3H, insulating layers 110c and 110b are patterned using a lithography mask for a desired pattern for the decoupling MIM capacitor 150. First, insulating layers 110c and 110b and etch stop layers 108a, 108b, and 108c are formed over the first metallization layer M1, as shown in FIG. 3B, and conductive lines 126b and vias 128a are formed in region 122. A separate lithography mask is then used to form patterns 113 in region 120 for the decoupling MIM capacitor 150, as shown in FIG. 3C. A bottom electrode material 114 is then formed or deposited over the second insulating layer 110c, as shown in FIG. 3D, lining the patterns 113 in the first and second insulating layers 110b and 110c. A top portion of the bottom electrode material 114 is removed from an upper part of sidewalls of the second insulating layer 110c, using a layer of photoresist 115, as shown in FIGS. 3D and 3E, and the bottom electrode material 114 is also removed from a top surface of the second insulating layer 110c in this embodiment. The portions of the bottom electrode material 114 removed may be removed using a photoresist 115 etch-back process that may recess the bottom electrode by a dimension $d_1$ comprising about 3,000 Angstroms from the top surface of the second insulating layer 110c, for example, as shown in FIG. 3E. Alternatively, portions of the bottom electrode material 114 may be removed using other methods and comprising other dimensions $d_1$.

Figure 3F:
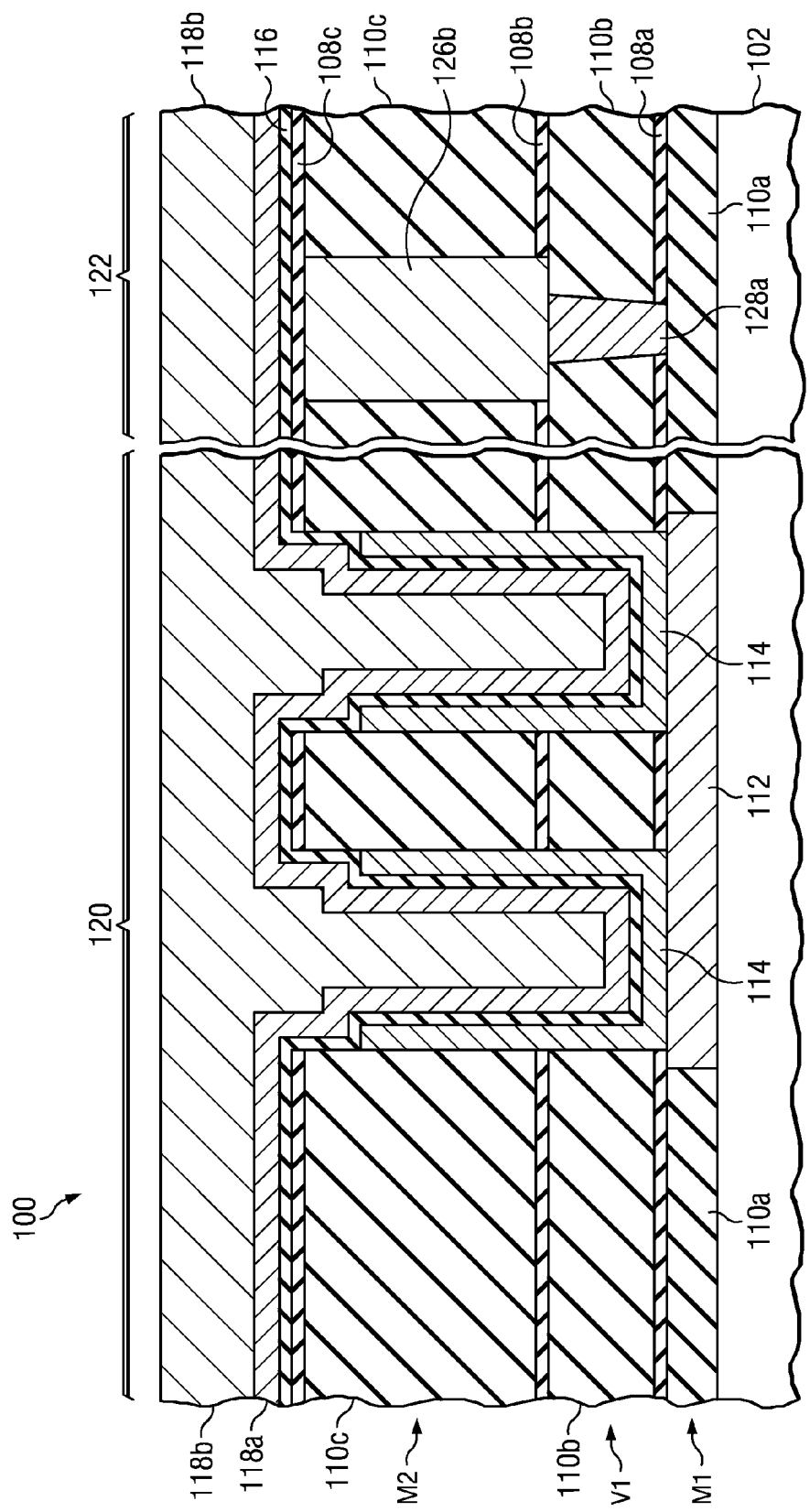
Figure 3G:
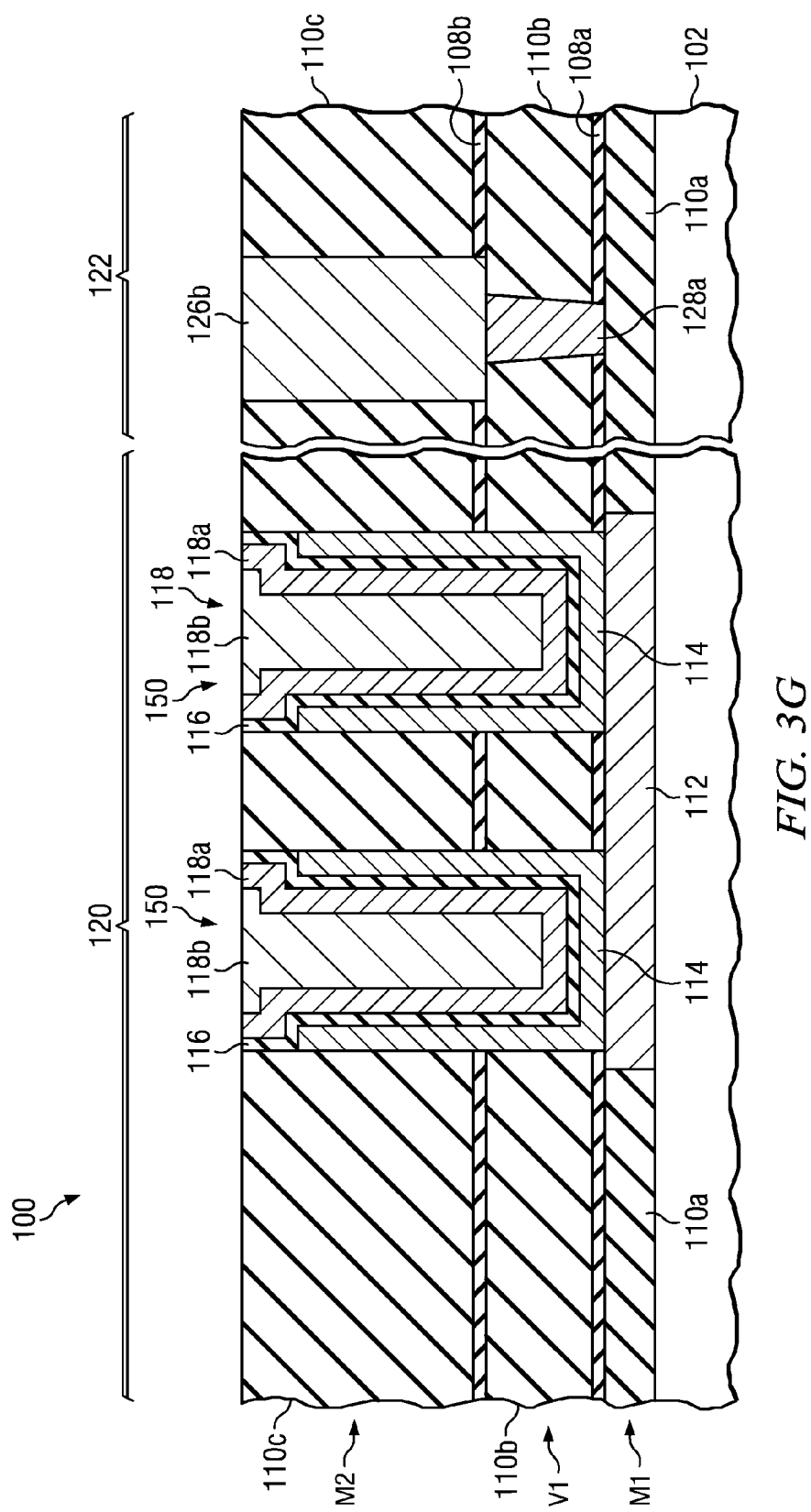
Figure 3H:
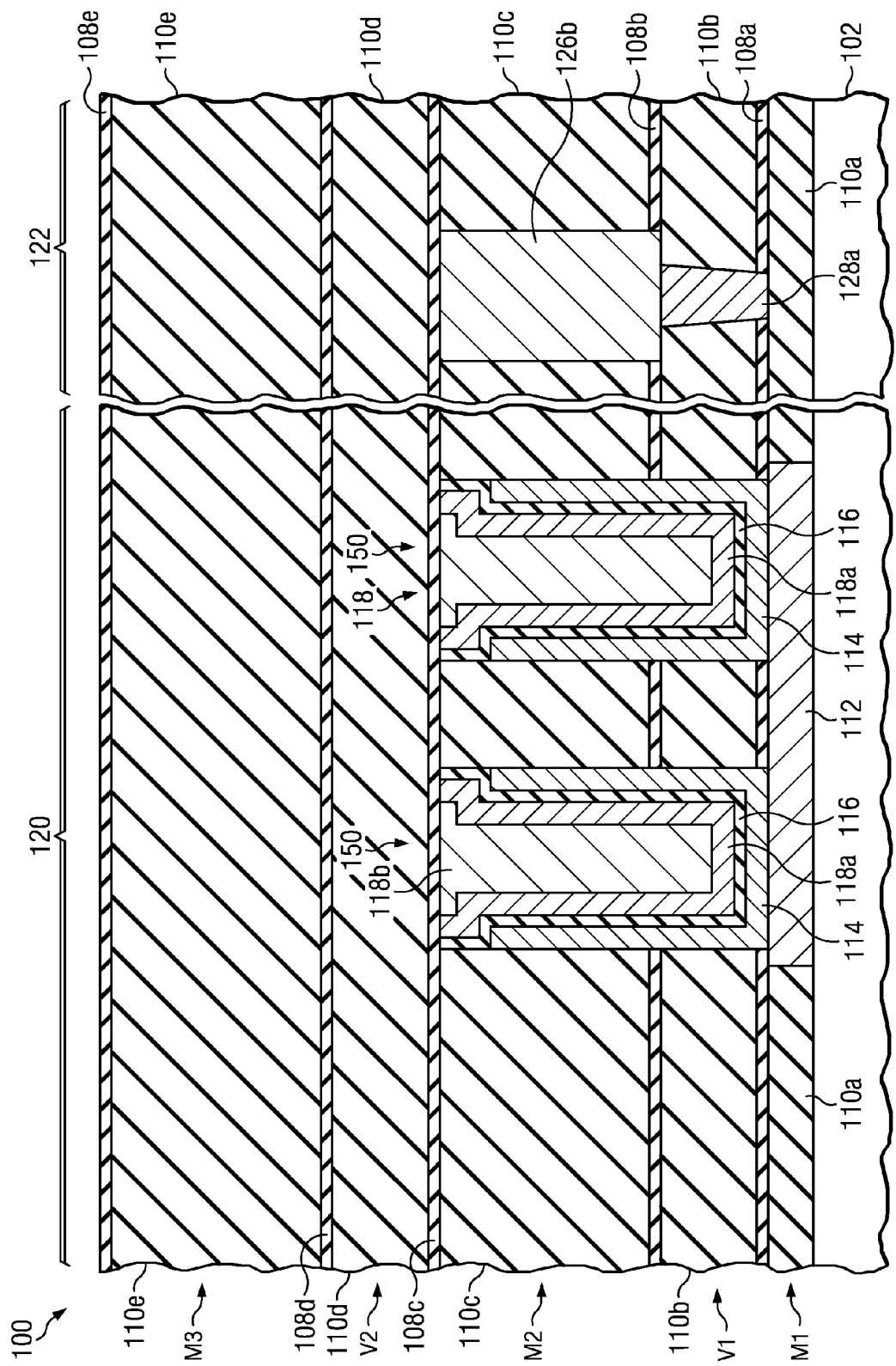

Next, the capacitor dielectric material 116 is formed over the bottom electrode material 114, over the top surface of the second insulating layer 110c, and over the exposed sidewalls of the second insulating layer 110c, as shown in FIG. 3F. A first top electrode material 118a is formed over the capacitor dielectric material 114, and a second top electrode material 118b is formed over the first top electrode material 118a, also shown in FIG. 3F. The first top electrode material 118a may comprise TiN or TaN and may function as a seed layer or liner for plating of the second top electrode material 118b that may comprise copper, for example. One or more CMP processes and/or etch processes are then used to remove the first and second top electrode materials 118a/118b and the capacitor dielectric material 116 from the top surface of the second insulating material 110c, as shown in FIG. 3G, forming at least one decoupling MIM capacitor 150 in metallization layers M2 and V1. The first top electrode material 118a and the second top electrode material 118b comprise the top electrode 118 of the decoupling MIM capacitor 150. Insulating layers 110d and 110e and etch stop layers 108c, 108d and 108e are formed over the at least one decoupling MIM capacitor 150, (e.g., etch stop layer 108c is redeposited after being removed in the step shown in FIG. 3G) as shown in FIG. 3H, and conductive lines 126c and vias 128b are formed in region 122 as shown in FIG. 3A.

In this embodiment, connections to the top electrode material 118b are made in metallization layers V2 and M3 disposed over the metallization layers M2 and V1 that the capacitor 150 is formed in. For example, top plate pick-up 124 is formed in metallization layer M3 that comprises a conductive line 126c layer, as shown in FIG. 3A. The top plate pick-up 124 is coupled to the top electrode material 118b by a via 142 formed in metallization layer V2 that comprises a via 128b layer for the interposer 100. Insulating layers 110d and 110e and etch stop layers 108d and 108e may comprise similar materials mentioned herein for layers 110a, 110b, and 110c, and 108a, 108b, and 108c, respectively, for example.

Figure 4A:
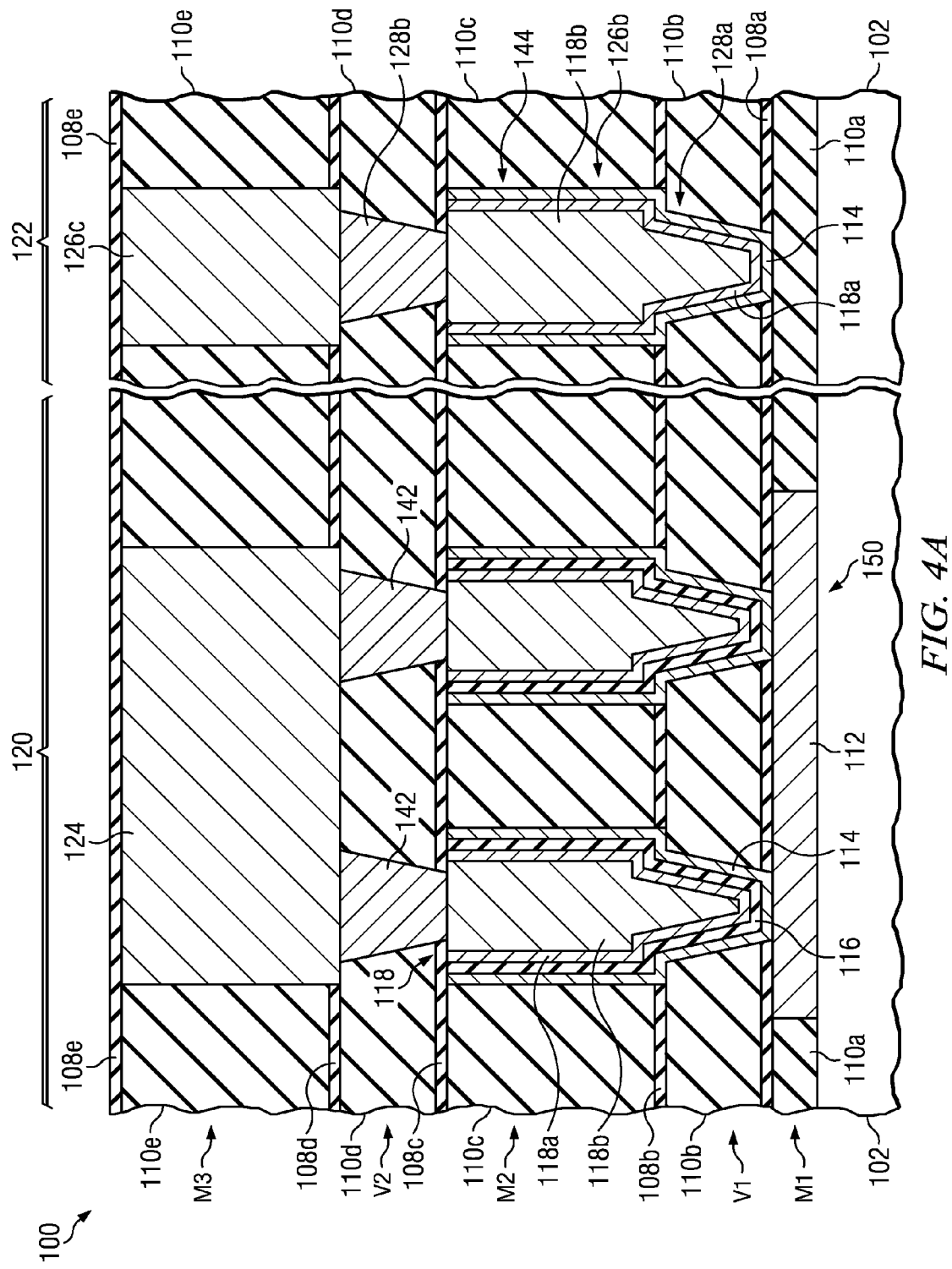
FIGS. 4A through 4F are cross-sectional views of a decoupling MIM capacitor formed in an interposer in accordance with yet another embodiment at various stages.
Figure 4B:
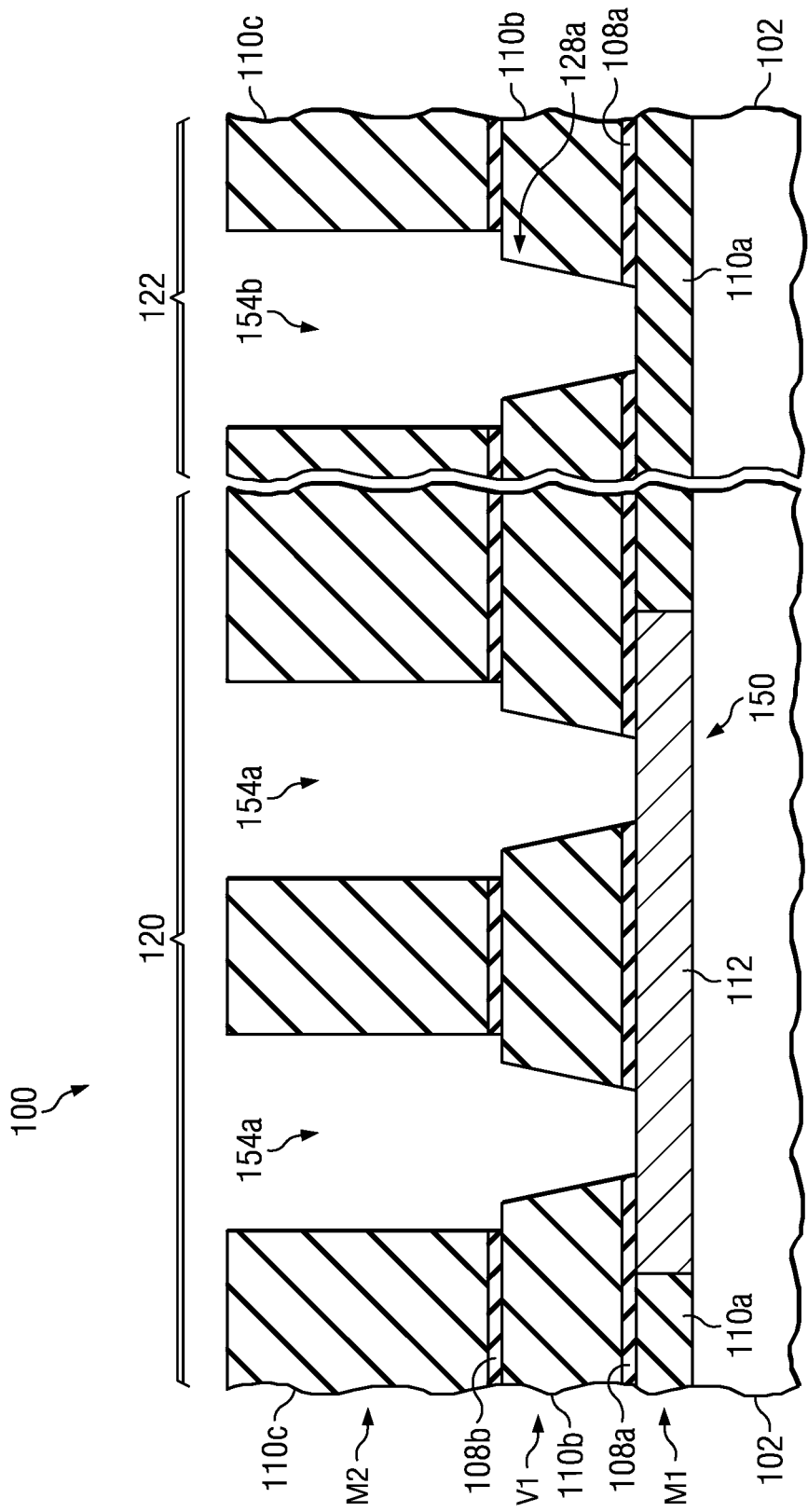

FIGS. 4A through 4F show cross-sectional views of decoupling MIM capacitors 150 formed in an interposer 100 in accordance with yet another embodiment of the present disclosure. In this embodiment, no additional lithography masks may be required to manufacture the novel decoupling MIM capacitors 150. Rather, another lithography mask already used in the manufacturing process flow having non-critical alignment dimensions may be used, such as a mask used to open the region 120 which may comprise an array region, if such a mask is available, for example. The second insulating layer 110c and the first insulating layer 110b are patterned with a pattern 154a for at least one decoupling MIM capacitor 150 in region 120 during a lithography process used to pattern the second insulating layer 110c and the first insulating layer 110b with a pattern 154b for a plurality of conductive lines 126b and a plurality of vias 128a, respectively, in region 122, in this embodiment, as shown in FIG. 4B.

Figure 4C:
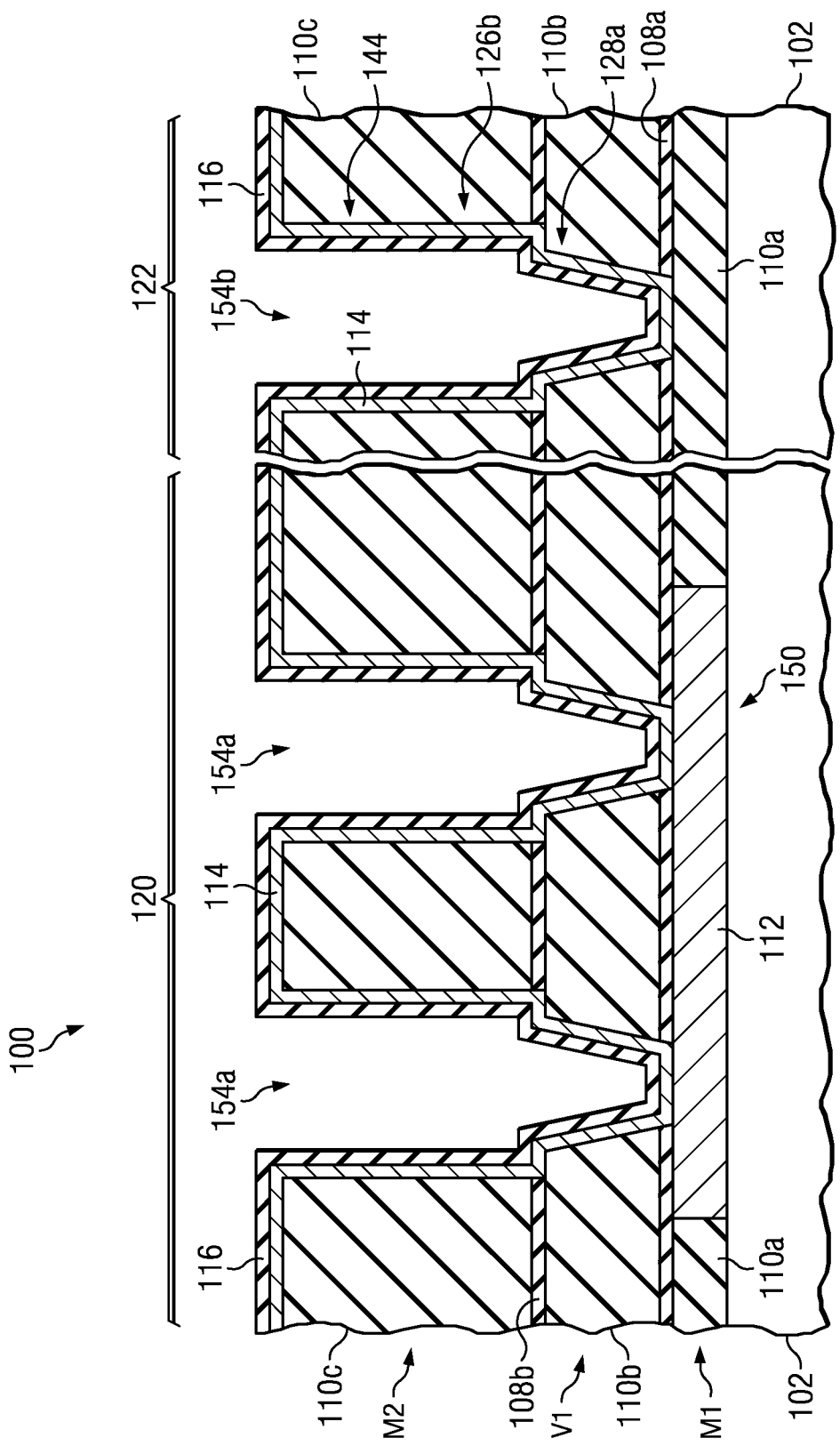
Figure 4D:
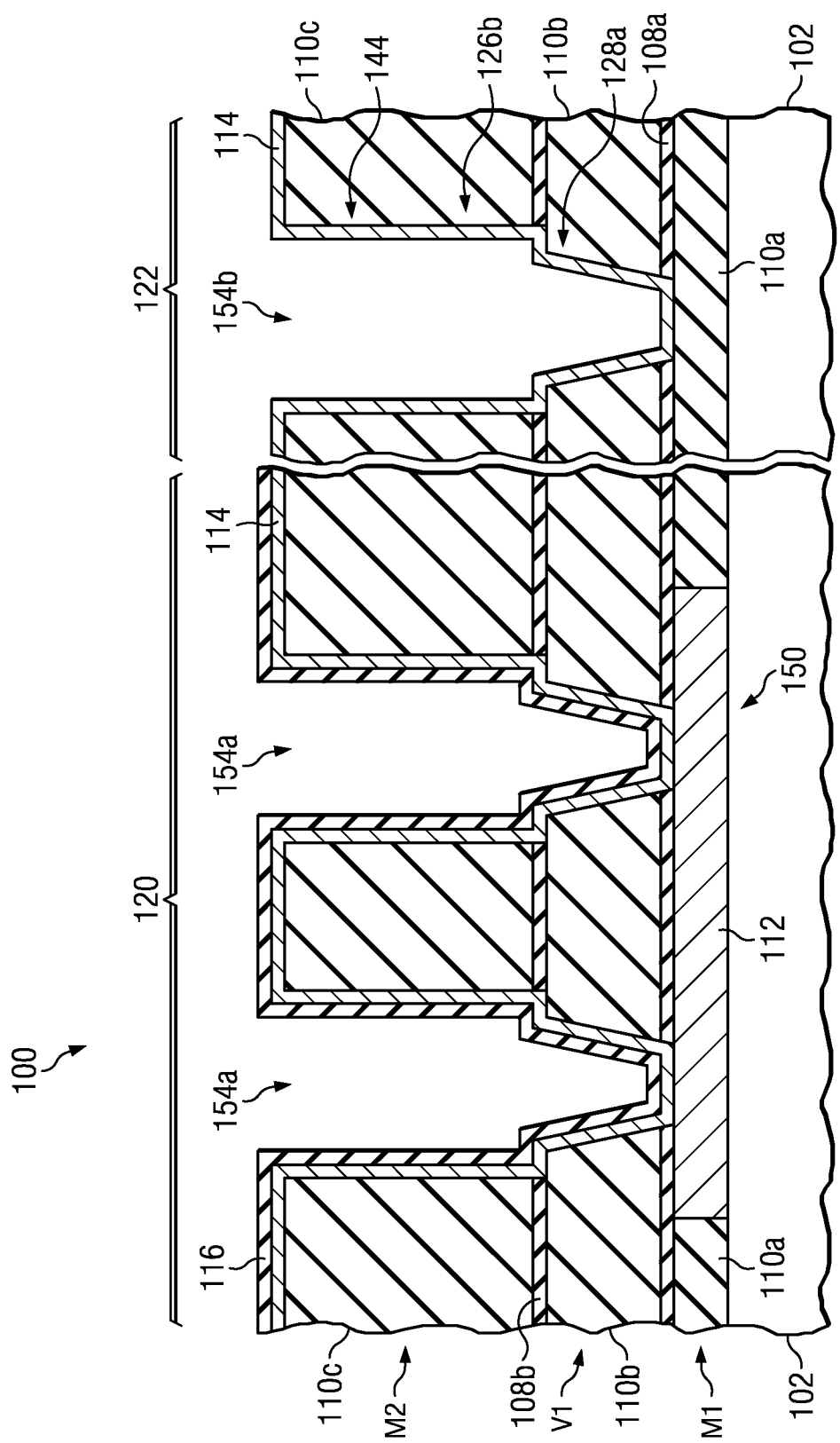

The bottom electrode material 114 is formed over the patterned second insulating layer 110c and first insulating layer 110b, lining the pattern 154a for the at least one decoupling MIM capacitor 150 and the pattern 154b for the conductive lines 126b and vias 128a in the first and second insulating layers 110b and 110c, as shown in FIG. 4C. The capacitor dielectric material 116 is formed over the bottom electrode material 114. The capacitor dielectric material 116 is removed from the pattern 154b for the plurality of conductive lines 126b and plurality of vias 128a in region 122, using the lithography mask described herein for this embodiment, as shown in FIG. 4D.

Figure 4E:
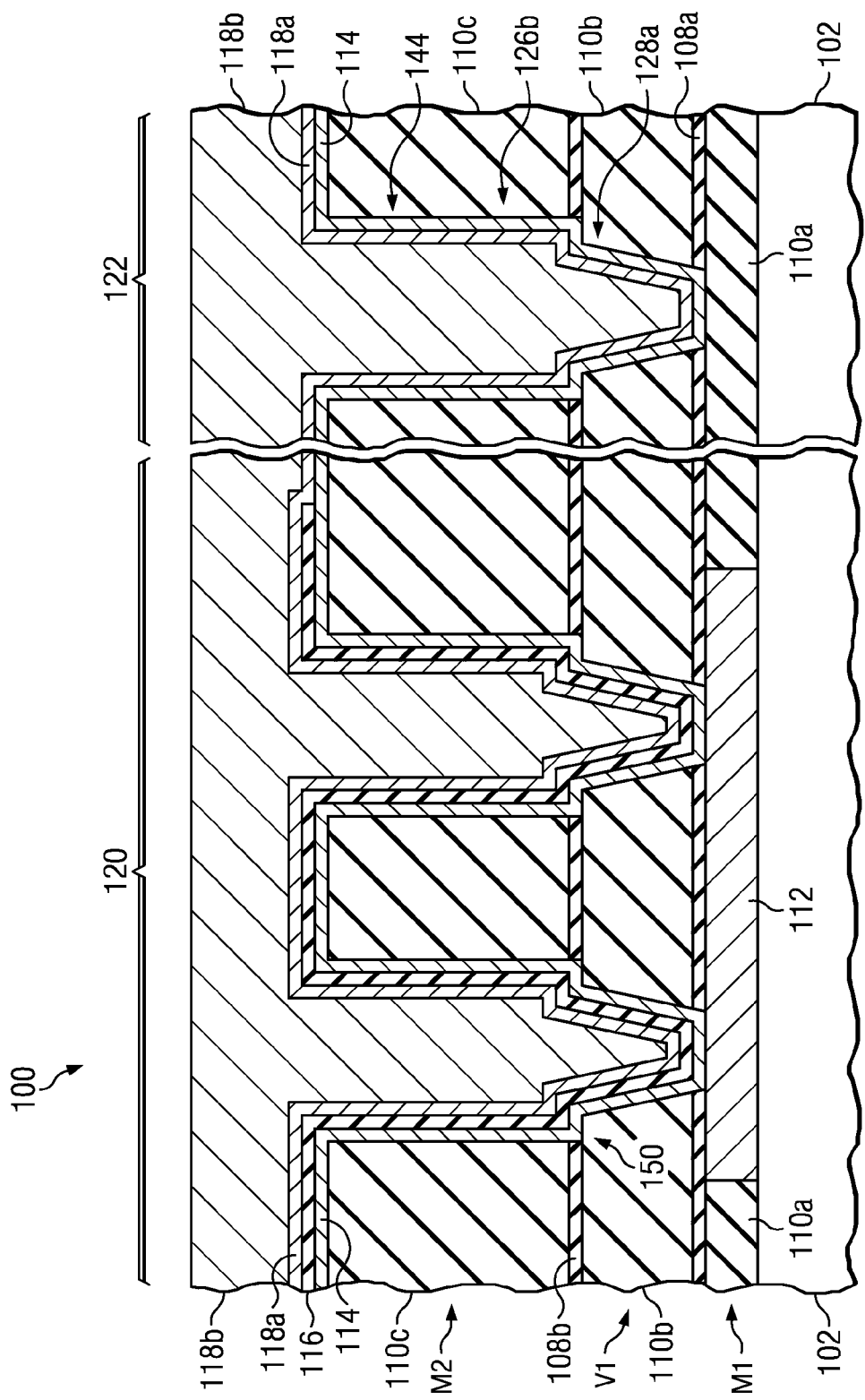

A first top electrode material 118a is formed over the capacitor dielectric material 116 in region 120 and over the bottom electrode material 114 in the pattern 154b for the plurality of vias 128a and plurality of conductive lines 126b in region 122, as shown in FIG. 4E. Layer 144 in region 122 comprises a first layer comprising bottom electrode material 114 and a second layer comprising top electrode material 118a. A second top electrode material 118b is formed over the first top electrode material 114, filling in the patterns 154 with conductive material and forming decoupling MIM capacitors 150 in region 120 and forming vias 128a and conductive lines 126b in region 122, as shown in FIG. 4E. Advantageously, the bottom electrode material 114 and first top electrode material 118a can be used as liners and/or seed layers 144 for the plating of conductive material of the second top electrode material 118b for conductive lines 126b and vias 128a in region 122, in this embodiment. The first top electrode material 118a and the second top electrode material 118b comprise the top electrode 118 of the decoupling MIM capacitors 150.

Figure 4F:
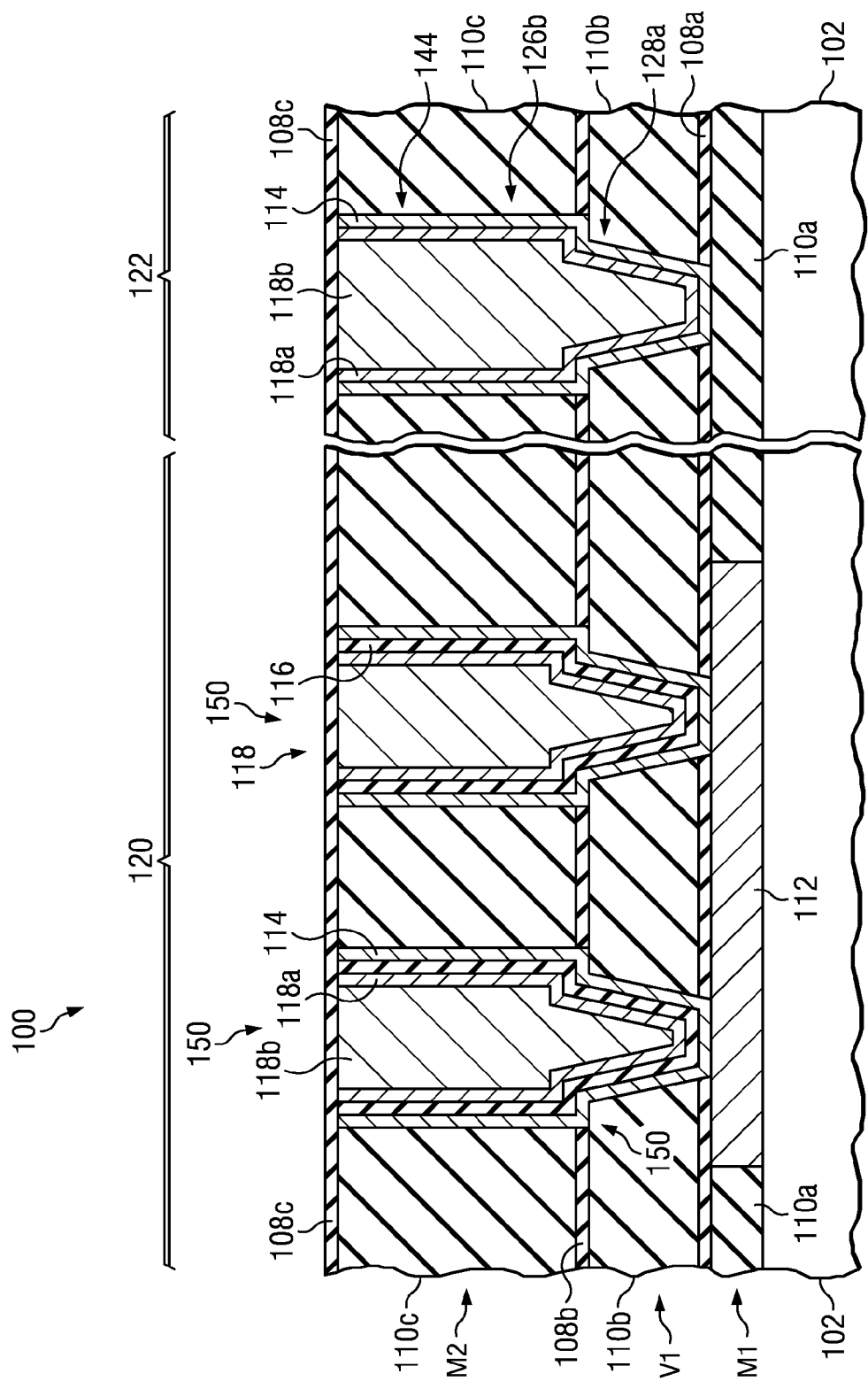

Next, one or more CMP processes and/or etch processes is used to remove the first and second top electrode materials 118a and 118b, the capacitor dielectric material 116, and the bottom electrode material 114 from the top surface of the second insulating material 110c, forming at least one decoupling MIM capacitor 150 in region 120, as shown in FIG. 4F. Etch stop layers 108c, 108d, 108e and insulating layers 110d and 110e are formed over the decoupling MIM capacitor 150 and conductive lines 126b, as shown in FIGS. 4F and 4A. As in the embodiment shown in FIG. 3, the top plate pick-up 124 is formed in a metallization layer M3 disposed over the decoupling MIM capacitor 150 and is coupled to the top electrodes 118 of the decoupling MIM capacitors 150 by vias 142.

Figure 5:
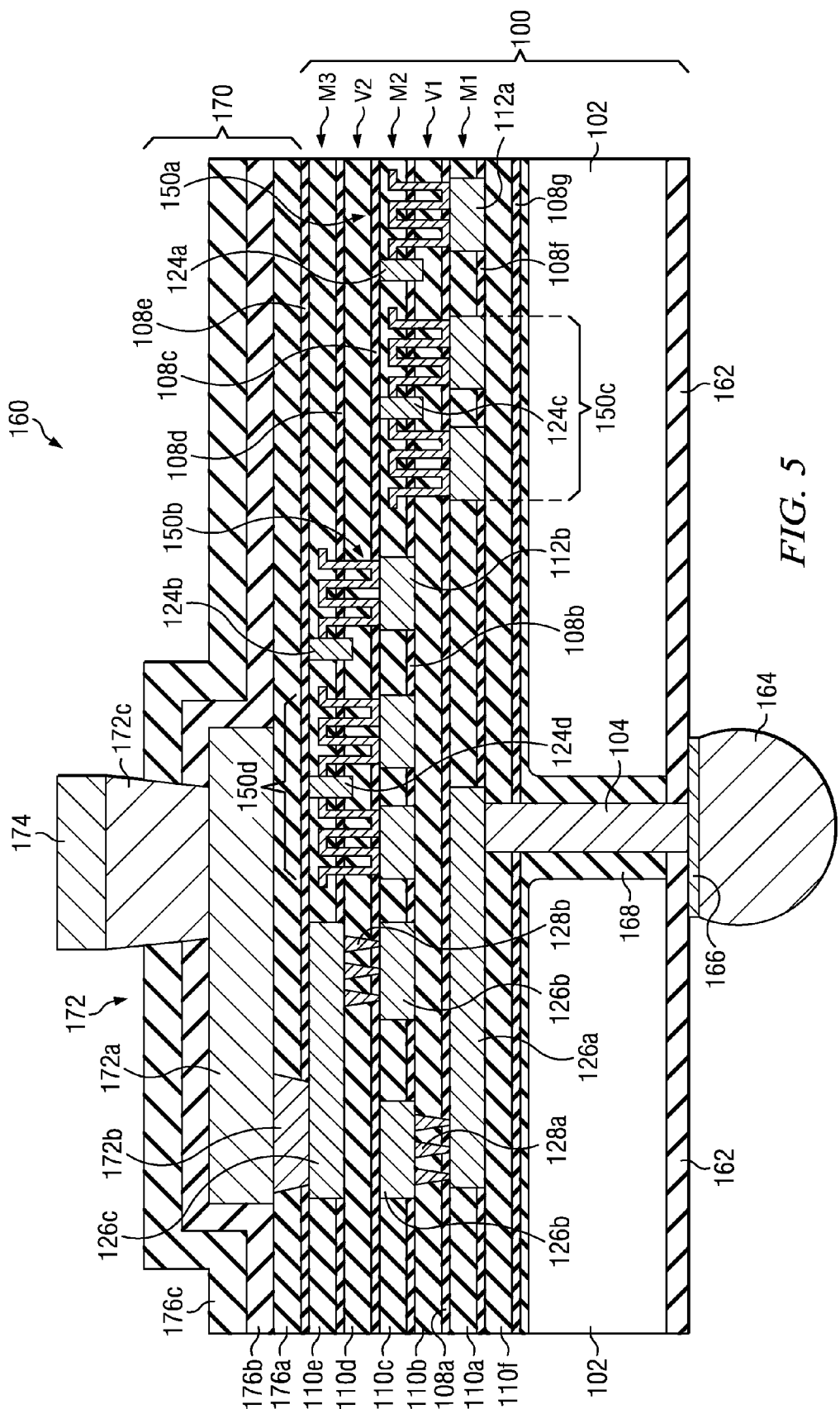
FIG. 5 shows a cross-sectional view of several decoupling MIM capacitors formed in an interposer.

FIG. 5 shows a cross-sectional view of several decoupling MIM capacitors 150a, 150b, 150c, and 150d formed in an interposer 100. The interposer 100 includes metallization layers M1, V1, M2, V2, and M3. FIG. 5 shows a package 160 for a semiconductor device that includes the interposer 100 described herein. The package 160 includes an insulating material 162 formed on a side opposite the metallization layers M1, V1, M2, V2, and M3. The insulating material 162 may comprise SiN, as an example, although other materials may be used. A plurality of solder balls 164 may be coupled to the TSVs 104 of the interposer 100, as shown. Contact pads 166 may be formed over the exposed ends of the TSVs 104, and the solder balls 164 may be formed on the contact pads 166, for example. The solder balls 164 may be used to couple the package 160 to another integrated circuit, circuit board, or other package, as examples.

Figure 6:
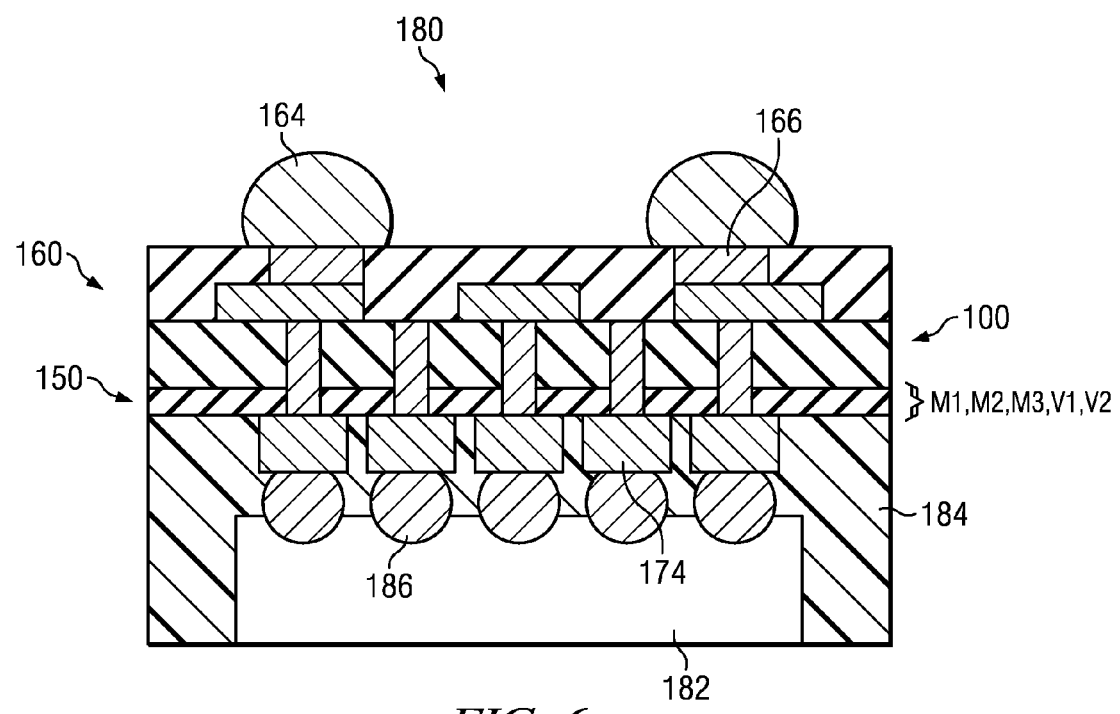
FIG. 6 shows a cross-sectional view of an integrated circuit packaged with a novel interposer having decoupling MIM capacitors described herein formed therein.

A wiring layer 170 may be formed on the interposer 100 in some embodiments proximate the metallization layers M1, V1, M2, V2, and M3. The wiring layer 170 may include a redistribution layer (RDL) 172. The RDL 172 may comprising wiring such as conductive lines 172a and vias 172b formed in insulating layers 176a, 176b, and 176c. The conductive lines 172a of the RDL 172 may be coupled to conductive lines 126c in upper metallization layer M3. The RDL 172 may include conductive regions 172c that are coupleable to microbumps 174 which may be formed thereon. The microbumps 174 may be used to couple the package 160 to integrated circuits 182 for packaging, as shown in a cross-sectional view in FIG. 6, which illustrates an integrated circuit 182 packaged using a novel interposer 100 including the decoupling MIM capacitors 150 described herein. A molding compound 184 may be disposed over the integrated circuit 182 which may comprise a die. The molding compound 184 also covers exposed portions of the interposer 100, as shown. The integrated circuit 182 may be bonded to the interposer using metal balls 186 that may comprise solder, gold, or other metals, as examples.

The decoupling MIM capacitors 150 may comprise single capacitors as shown in FIG. 3A, or the decoupling MIM capacitors 150 may comprise one or more capacitors coupled together in parallel or series, or positioned proximate one another, as shown in FIGS. 1A, 1F, 1G, 3G, 3H, 4A and 4F, depending on the application. The decoupling MIM capacitors 150 may also be configured in a single stage (see 150a and 150b of FIG. 5) or two stages (see 150c and 150d of FIG. 5). Two stages may be used to achieve a large bias, by coupling two decoupling MIM capacitors 150 in series, for example.

Advantages of embodiments of the disclosure include providing novel decoupling MIM capacitor 150 designs for interposers 100. The decoupling MIM capacitors 150 may be formed in any two adjacent metallization layers and provide a large amount of capacitance density. The decoupling MIM capacitors 150 reduce noise and stabilize power signals. The decoupling MIM capacitors 150 are particularly useful in low $V_{DD}$ applications where the signal-noise ratio can be sensitive. The novel decoupling MIM capacitor 150 structures and designs are easily implementable in manufacturing process flows for interposers 100.

Very high MIM capacitance densities are achievable by embodiments of the present disclosure. For example, if high k materials are used for the capacitor dielectric material 116, capacitances of about 60 to 200 fF/$\mu m^2$ may be achieved with an effective oxide thickness (EOT) of the capacitor dielectric material 116 of about 13 Angstroms. Furthermore, the thicknesses of the metallization layers M1, V1, M2, V2, and M3 of the interposers 100 are sufficient, e.g., around 10,000 Angstroms to 20,000 Angstroms in some embodiments, to produce decoupling MIM capacitors 150 having a high capacitance.

Embodiments of the present disclosure include methods of forming decoupling MIM capacitors 150, and also include interposers 100 and packages 160 that include the decoupling MIM capacitors 150. Embodiments of the present disclosure also include packaged semiconductor devices 180 that have been packaged using the novel interposers 100 and packages 160 described herein.

In accordance with one embodiment of the present disclosure, a method of forming a decoupling capacitor includes providing a packaging device, and forming a decoupling MIM capacitor in at least two metallization layers of the packaging device.

In accordance with another embodiment, a method of forming a decoupling capacitor in an interposer includes providing a workpiece and forming a first metallization layer over the workpiece. A second metallization layer is formed over the first metallization layer. A decoupling MIM capacitor is formed in the first metallization layer and the second metallization layer.

In accordance with yet another embodiment, an interposer for packaging a semiconductor device includes a workpiece and a plurality of metallization layers disposed over the workpiece. At least one decoupling MIM capacitor is disposed in at least two of the plurality of metallization layers.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a decoupling capacitor in an interposer, the method comprising:
    providing a workpiece;
    forming a first metallization layer over the workpiece and a second metallization layer over the first metallization layer, wherein forming the first metallization layer comprises forming a first insulating layer over the workpiece, patterning the first insulating layer, and filling the patterned first insulating layer with a conductive material, and wherein forming the second metallization layer comprises forming a second insulating layer over the workpiece, patterning the second insulating layer, and filling the patterned second insulating layer with a conductive material;
    forming a decoupling metal-insulator-metal (MIM) capacitor in the first metallization layer and the second metallization layer,wherein forming the decoupling MIM capacitor comprises patterning the first insulating layer and the second insulating layer, and forming a bottom electrode material over the patterned first insulating layer and second insulating layer, forming a capacitor dielectric material over the bottom electrode material, and forming a top electrode material over the capacitor dielectric material; and
    forming a bottom plate pick-up coupled to the bottom electrode material, before forming the bottom electrode material, wherein forming the bottom plate pick-up comprises forming the bottom plate pick-up in a metallization layer of the interposer disposed beneath the first metallization layer.

2. A method of forming a decoupling capacitor in an interposer, the method comprising:
    providing a workpiece;
    forming a first metallization layer over the workpiece;

forming a second metallization layer over the first metallization layer; and forming a decoupling metal-insulator-metal (MIM) capacitor in the first metallization layer and the second metallization layer;

wherein the forming the first metallization layer, forming the second metallization layer, and forming the decoupling MIM capacitor comprise:

forming a first insulating layer over the workpiece;

forming a second insulating layer over the first insulating layer;

patterning the second insulating layer and the first insulating layer with a pattern for at least one decoupling MIM capacitor;

forming a bottom electrode material over the second insulating layer, lining the pattern in the first and second insulating layers;

removing the bottom electrode material from a top surface of the second insulating layer;

forming a capacitor dielectric material over the bottom electrode material and over the top surface of the second insulating layer;

forming a top electrode material over the capacitor dielectric material; and patterning the top electrode material and the capacitor dielectric material, forming at least one decoupling MIM capacitor.

3. A method of forming a decoupling capacitor in an interposer, the method comprising:

providing a workpiece;

forming a first metallization layer over the workpiece;

forming a second metallization layer over the first metallization layer; and forming a decoupling metal-insulator-metal (MIM) capacitor in the first metallization layer and the second metallization layer;

wherein the forming the first metallization layer, forming the second metallization layer, and forming the decoupling MIM capacitor comprise:

forming a first insulating layer over the workpiece;

forming a second insulating layer over the first insulating layer;

patterning the second insulating layer and the first insulating layer with a pattern for at least one decoupling MIM capacitor;

forming a bottom electrode material over the second insulating layer, lining the pattern in the first and second insulating layers;

removing a top portion of the bottom electrode material on sidewalls of the second insulating layer and removing the bottom electrode material from a top surface of the second insulating layer;

forming a capacitor dielectric material over the bottom electrode material, over the top surface of the second insulating layer, and over the sidewalls of the second insulating layer;

forming a first top electrode material over the capacitor dielectric material;

forming a second top electrode material over the first top electrode material; and performing a chemical-mechanical polish (CMP) process to remove the first and second top electrode materials and the capacitor dielectric material from the top surface of the second insulating material, forming at least one decoupling MIM capacitor.

4. A method of forming a decoupling capacitor in an interposer, the method comprising:

providing a workpiece;

forming a first metallization layer over the workpiece;

forming a second metallization layer over the first metallization layer; and forming a decoupling metal-insulator-metal (MIM) capacitor in the first metallization layer and the second metallization layer;

wherein forming the first metallization layer, forming the second metallization layer, and forming the decoupling MIM capacitor comprise:

forming a first insulating layer over the workpiece;

forming a second insulating layer over the first insulating layer;

patterning the second insulating layer and the first insulating layer with a pattern for at least one decoupling MIM capacitor during a lithography process used to pattern the second insulating layer with a pattern for a plurality of conductive lines and during a lithography process used to pattern the first insulating layer with a pattern for a plurality of vias;

forming a bottom electrode material over the patterned second insulating layer and first insulating layer, lining the patterns in the first and second insulating layers;

forming a capacitor dielectric material over the bottom electrode material;

removing the capacitor dielectric material from the pattern for the plurality of conductive lines and from the pattern for the plurality of vias;

forming a first top electrode material over the capacitor dielectric material and over the bottom electrode material in the pattern for the plurality of vias and in the pattern for the plurality of conductive lines;

forming a second top electrode material over the first top electrode material; and performing a chemical-mechanical polish (CMP) process to remove the first and second top electrode materials, the capacitor dielectric material, and the bottom electrode material from the top surface of the second insulating material, forming at least one decoupling MIM capacitor.

5. A method of forming a decoupling capacitor in an interposer, the method comprising:

providing a workpiece;

forming a first metallization layer over the workpiece;

forming a second metallization layer over the first metallization layer;

forming a decoupling metal-insulator-metal (MIM) capacitor in the first metallization layer and the second metallization layer;

forming a bottom plate pick-up, before forming the first metallization layer;

forming a first insulating layer over the bottom plate pick-up, the first insulating layer comprising an insulating layer for the first metallization layer;

form a second insulating layer over the first insulating layer, the second insulating layer comprising an insulating layer for the second metallization layer;

patterning the first and second insulating layers;

depositing a bottom electrode material, at least a portion of the bottom electrode material being coupled to the bottom plate pick-up;

depositing a capacitor dielectric material over the bottom electrode material;

depositing a top electrode material over the capacitor dielectric material;

patterning the bottom electrode material, the capacitor dielectric material, and the top electrode material; and forming a top plate pick-up, the top plate pick-up being coupled to at least a portion of the top electrode material, wherein forming the first metallization layer comprises forming a plurality of vias and a portion of the decoupling MIM capacitor in the first insulating layer, and wherein forming the second metallization layer comprises forming a plurality of conductive lines and a portion of the decoupling MIM capacitor in the second insulating layer.

6. The method of claim 1, wherein the workpiece is an interposer.

7. The method of claim 6, wherein the interposer comprises a substrate with a plurality of through-substrate vias (TSVs) formed therein.

8. The method of claim 7, wherein the interposer comprises a three dimensional integrated circuit (3DIC) interposer.

9. The method of claim 2, wherein the workpiece is an interposer.

10. The method of claim 9, wherein the interposer comprises a substrate with a plurality of through-substrate vias (TSVs) formed therein.

11. The method of claim 10, wherein the interposer comprises a three dimensional integrated circuit (3DIC) interposer.

12. The method of claim 3, wherein the workpiece is an interposer.

13. The method of claim 12, wherein the interposer comprises a substrate with a plurality of through-substrate vias (TSVs) formed therein.

14. The method of claim 13, wherein the interposer comprises a three dimensional integrated circuit (3DIC) interposer.

15. The method of claim 4, wherein the workpiece is an interposer.

16. The method of claim 15, wherein the interposer comprises a substrate with a plurality of through-substrate vias (TSVs) formed therein.

17. The method of claim 16, wherein the interposer comprises a three dimensional integrated circuit (3DIC) interposer.

18. The method of claim 5, wherein the workpiece is an interposer.

19. The method of claim 18, wherein the interposer comprises a substrate with a plurality of through-substrate vias (TSVs) formed therein.

20. The method of claim 19, wherein the interposer comprises a three dimensional integrated circuit (3DIC) interposer.

* * * * *